(12) United States Patent
Ogihara et al.

(10) Patent No.: US 8,343,848 B2
(45) Date of Patent: Jan. 1, 2013

(54) SEMICONDUCTOR DEVICE, LED PRINT HEAD AND IMAGE-FORMING APPARATUS USING SAME, AND METHOD OF MANUFACTURING SEMICONDUCTOR DEVICE

(75) Inventors: Mitsuhiko Ogihara, Hachioji (JP); Hiroyuki Fujiwara, Hachioji (JP); Ichimatsu Abiko, Tokyo (JP); Masaaki Sakuta, Tokyo (JP)

(73) Assignee: Oki Data Corporation, Tokyo (JP)

( * ) Notice: Subject to any disclaimer, the term of this patent is extended or adjusted under 35 U.S.C. 154(b) by 170 days.

(21) Appl. No.: 12/165,699

(22) Filed: Jul. 1, 2008

(65) Prior Publication Data

US 2008/0274571 A1  Nov. 6, 2008

Related U.S. Application Data

(62) Division of application No. 10/970,637, filed on Oct. 21, 2004, now Pat. No. 7,408,566.

(30) Foreign Application Priority Data

Oct. 22, 2003  (JP) ................................. 2003-361512

(51) Int. Cl.
  *H01L 21/30* (2006.01)
(52) U.S. Cl. ........ 438/458; 438/455; 438/456; 438/457; 438/459; 347/130; 347/238; 347/242; 347/245; 347/257
(58) Field of Classification Search .................. 347/130, 347/238, 242, 245, 257, 263; 438/455–459
  See application file for complete search history.

(56) References Cited

U.S. PATENT DOCUMENTS

| | | | |
|---|---|---|---|
| 5,610,685 A | 3/1997 | Aiba | |
| 6,559,879 B1 | 5/2003 | Kobayashi et al. | |
| 6,613,610 B2 | 9/2003 | Iwafuchi et al. | |
| 6,746,889 B1* | 6/2004 | Eliashevich et al. | 438/33 |
| 7,239,337 B2 | 7/2007 | Ogihara et al. | |
| 2002/0064032 A1 | 5/2002 | Oohata | |
| 2002/0096994 A1* | 7/2002 | Iwafuchi et al. | 313/495 |
| 2004/0027314 A1* | 2/2004 | Natori | 345/30 |
| 2004/0125197 A1 | 7/2004 | Ogihara et al. | |
| 2005/0020032 A1* | 1/2005 | Solanki et al. | 438/458 |

FOREIGN PATENT DOCUMENTS

| | | |
|---|---|---|
| EP | 1267420 A2 | 12/2002 |
| EP | 1326289 A2 | 7/2003 |
| JP | 56-017385 A | 2/1981 |

(Continued)

OTHER PUBLICATIONS

Takekida, "Design of LED Printers", Published by Kabushiki Kaisha Triceps, pp. 114-116 (1985).

(Continued)

*Primary Examiner* — Jae Lee
(74) *Attorney, Agent, or Firm* — Panitch Schwarze Belisario & Nadel LLP

(57) ABSTRACT

In a method of manufacturing a semiconductor thin film piece device, a plurality of semiconductor thin film pieces (14) are selected from among the semiconductor thin film pieces (14) formed on a first substrate (35), and bonded to a first set of predetermined area on a second substrate (12). Subsequently, a plurality of semiconductor thin film pieces are selected from the remaining semiconductor thin film pieces (14), and bonded to a second set of predetermined area.

8 Claims, 36 Drawing Sheets

FOREIGN PATENT DOCUMENTS

| | | | |
|---|---|---|---|
| JP | 59-040542 A | 3/1984 |
| JP | 63-249669 A | 10/1988 |
| JP | 02184466 A | 7/1990 |
| JP | 07-235690 A | 9/1995 |
| JP | 10041586 A | 2/1998 |
| JP | 11191642 A | 7/1999 |
| JP | 11307878 A | 11/1999 |
| JP | 2002261335 A | 9/2002 |
| JP | 2003204047 A | 7/2003 |
| WO | 02063678 A1 | 8/2002 |

OTHER PUBLICATIONS

Office Action issued May 11, 2010 in Japanese Application No. 2004-302849.

European Search Report issued Mar. 28, 2011 in EP Application No. 04025240.5.

* cited by examiner

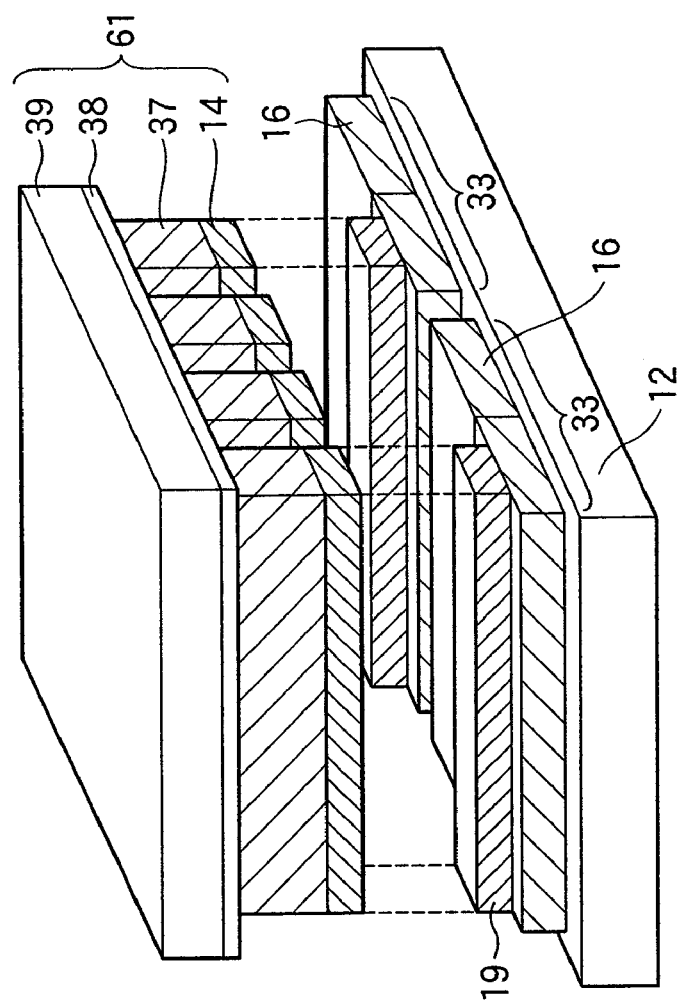
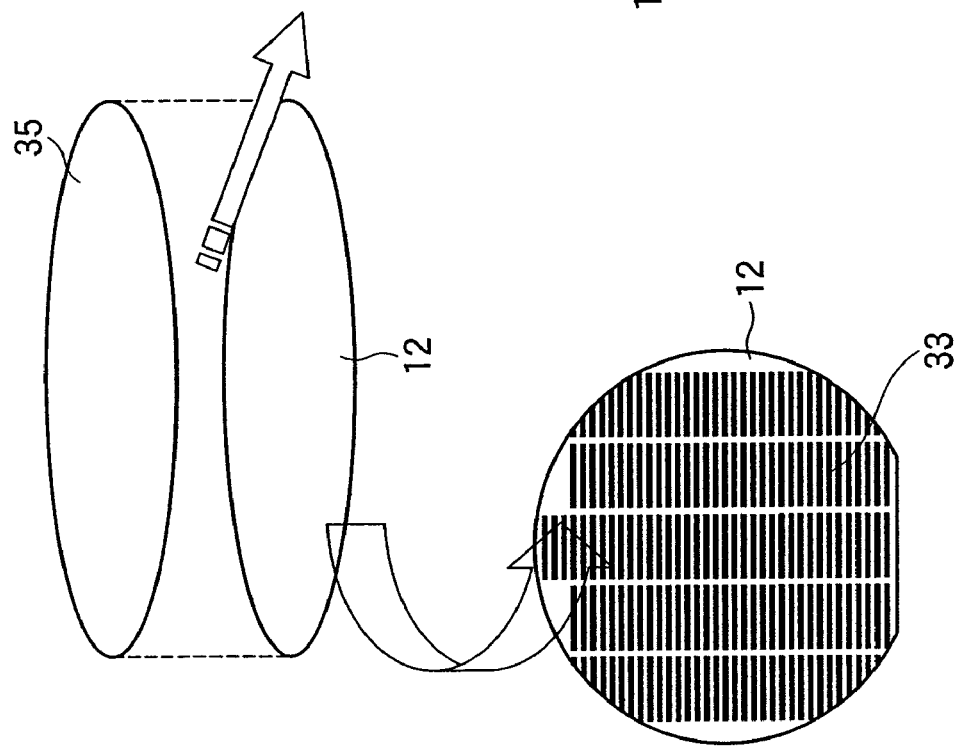
FIG.7A
FIG.7B
FIG.7C

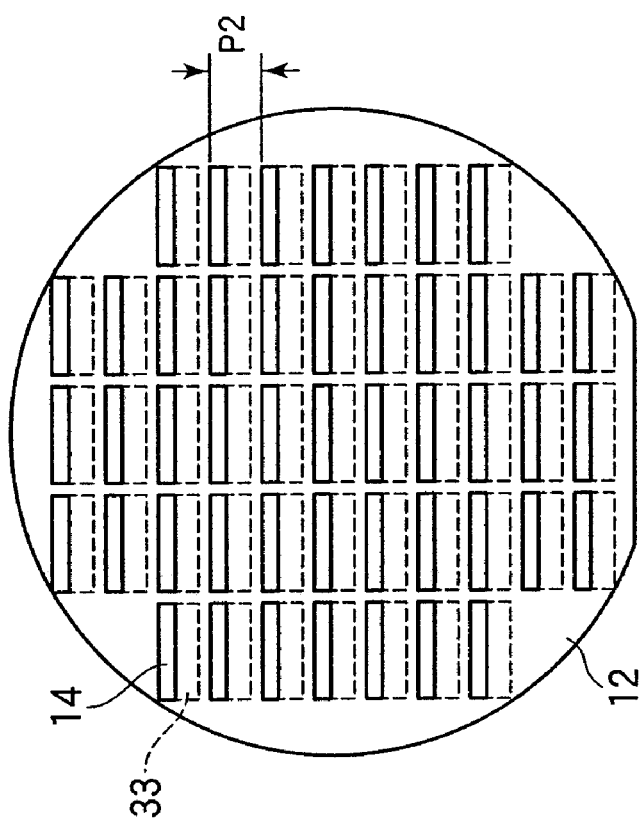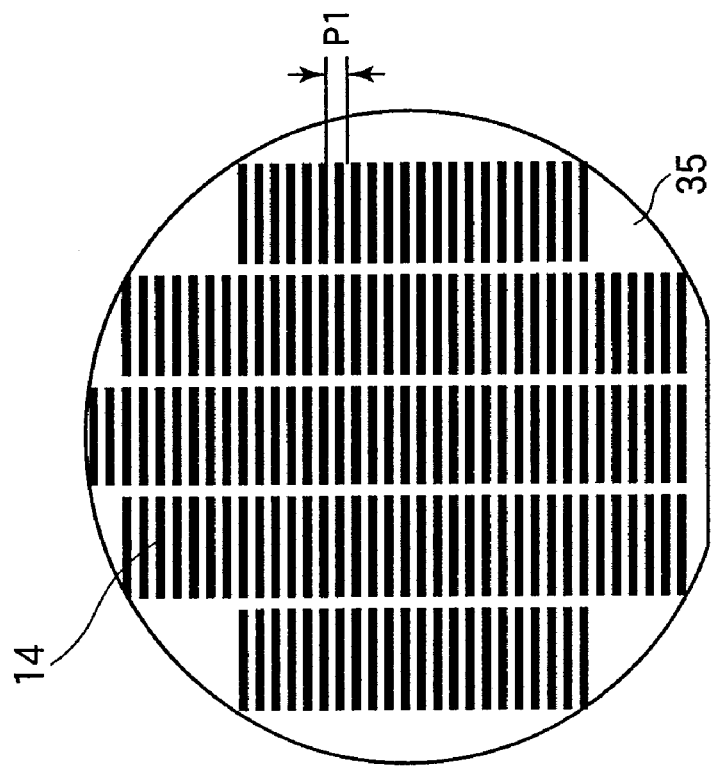

SEMICONDUCTOR DEVICE, LED PRINT HEAD AND IMAGE-FORMING APPARATUS USING SAME, AND METHOD OF MANUFACTURING SEMICONDUCTOR DEVICE

CROSS-REFERENCE TO RELATED APPLICATIONS

This application is a Divisional of U.S. patent application Ser. No. 10/970,637, filed Oct. 21, 2004, the disclosure of which is incorporated herein by reference.

BACKGROUND OF THE INVENTION

This invention relates an LED print head which is used for example in an electrophotographic printer or copier, and in which light-emitting diodes (LEDs) for forming images are aligned in rows.

An LED unit in which a plurality of LED array chips are arranged in a straight line, and driver chips are also provided is known as a light source for forming images (exposure), in printers or copies using electrophotography, and an LED print head which is an elongated semiconductor device wherein a linear rod lens array which collimates light beams output from the light-emitting parts of the LED units respectively to predetermined positions on an electrophotographic photosensitive drum, is integrated with an LED unit, is known as an exposure device.

Also, in an example of a light-emitting diode which does not require an AlGaAs thick film layer, a light-emitting part comprising a plurality of epitaxial layers is formed on the upper side of a substrate, a partial electrode is formed in the center of a front surface of the epitaxial layer while a whole-surface electrode is formed on the lower surface of the substrate, the substrate and the plurality of epitaxial layers forming the light-emitting parts are spatially connected in the center, and a gap layer is formed between the substrate and the epitaxial layers except at this connecting part (see for example Japanese Patent Kokai Publication No. H7-235690 (p. 3-5, FIG. 1).

However, for example, in LED array chips 312 of an LED print head 310 of the prior art shown in FIG. 40, individual electrode pads 312c connected via individual electrodes 312b to respective light-emitting parts 312a as shown in FIG. 41 are required to have a relatively large surface area (e.g., 100 μm×100 μm) for wire bonding. Also, as shown in FIG. 40, the same number of individual electrode pads 312c are required as the number of connecting wires 314 between the LED array chips 312 and driver IC chips 313, so it is difficult to reduce the surface area of the LED array chips 312, and to make the LED array chips 312 compact.

Likewise, individual electrode pads for connection via wires 314 to LED array chip 312, as well as electrode pads for connection via wires 315 to a printed circuit board 311 must also be provided on the surfaces of driver IC (integrated circuit) chips 313. As shown in FIG. 40, the same number of individual electrode pads are required as the number of the connection wires 314 between the two chips, and the same number of electrode pads as the number of connection wires 315 between the driver IC chips 313 and the mounting substrate 311 are required, so it is difficult to reduce the surface area of the driver IC chips 313 and to make the driver IC chips 313 compact.

Also, when an optical fiber array on a base plate is used, electrodes are formed on a plurality of light-emitting diode array chips and corresponding electrodes are formed in circuit conductors, so it is difficult to reduce the surface area of the diode array chips and circuit conductors, and to make them compact.

For the same reason, when it is attempted to reduce the chip width to reduce the material costs, there is a limit in the amount of chip width reduction due to the provision of the electrode pads, and it is difficult to substantially reduce the material cost of the LED array chips 312 and driver IC chips 313.

Considering now the proportion of the light-emitting areas and other areas in a device having LED array chips 312 and driver IC chips 313, the individual electrode pads 312c occupy a larger area than the light-emitting parts 312a, so the proportion of material required to form electrode pads such as the individual electrode pads 312c which are non-light-emitting areas is large, and the proportion of material required for surface area functioning as light-emitting areas, is small. This is ineffective from the viewpoint of material usage efficiency. Moreover, even if it is attempted to improve material usage efficiency, as long as electrode pads are provided on the chips, material is required for the area occupied by the electrode pads, and a significant improvement of material usage efficiency is difficult to accomplish.

The thickness of the LED array chips 312 has to be adjusted to a thickness (e.g., approximately 300 μm-350 μm) equivalent to that of the driver IC chips 313 for easier handling of the chips during die bonding and to prevent problems such as short circuits between wires and chips, and to facilitate wire-loop formation during wire bonding. In an example shown in FIG. 42, a GaAsP epitaxial layer 324 is formed on a GaAs substrate 325, and a Zn diffusion region 321 is formed in part of the GaAsP epitaxial layer 324. An individual electrode 322 is provided on the Zn diffusion region 321, an interlayer insulation film 323 is formed except at the vicinity of the individual electrode 322 on the GaAsP epitaxial layer 324, and a rear electrode 326 is formed underneath the GaAs substrate 325. The Zn diffusion region 321 which forms a pn junction has a depth of approximately 3 μm-5 μm from the surface of the GaAsP epitaxial layer 324, but the GaAsP epitaxial layer 324 is formed as thick as approximately 50 μm-100 μm to decrease the defect density in the area forming the pn junction, and the GaAs substrate 325 is formed to have a thickness of approximately 250 μm-300 μm in order to maintain ease of chip handling.

However, the region which functions as light-emitting region is approximately 3 μm-5 μm of the Zn diffusion region 321, far smaller than the thickness of the LED array chip 312 which is approximately 300 μm-350 μm, so if the thickness of the LED array chip 312 is made equivalent to that of the driver IC chip 313, it is uneconomical from the viewpoint of material usage efficiency. Also, from the viewpoint of the light-emitting function, although the GaAs substrate 325 merely supports the GaAsP epitaxial layer 324 which provides the light-emitting function, and the GaAs substrate 325 itself is not involved in the light-emitting function, a thickness of several hundred μm is required for ensuring a sufficient yield rate in the production of the support and wire bonding. As it is difficult to reduce the thickness, it is difficult to reduce materials and cut down on material costs.

The amount of semiconductor material can be reduced by forming semiconductor thin film pieces of LED array chips on a first semiconductor substrate, and transferring and bonding the semiconductor thin film pieces onto a second semiconductor substrate. By this method, the LED array chips can be made thinner than the GaAs substrate. However, the parts (bonding layers) of the second semiconductor substrate where the semiconductor thin film pieces are to be bonded have to be higher than other parts for ease of bonding.

Also, if the bonding layers are made from a noble metal, since the bonding layers must be higher than the other parts as described above, the material cost of the bonding layers is increased. The amount of time required for forming the bonding layers is also substantial.

In addition, the arrangement pitch of the semiconductor thin film pieces of the LED array chips formed on the first semiconductor substrate is typically different from the arrangement pitch of the driver IC chip areas formed on the second semiconductor substrate, so it is necessary to have the thin film pieces conform with (or converting their pitch into conformity with) the arrangement pitch of the driver IC chip areas for the LED array chips, and thereafter bond a plurality of semiconductor thin film pieces, while simultaneously supporting them. This however is difficult.

BRIEF SUMMARY OF THE INVENTION

It is an object of this invention to reduce the cost of a semiconductor device. Another object of the invention is to provide a method of manufacturing a semiconductor device wherein a plurality of semiconductor thin film pieces which are supported at a first pitch can be bonded in predetermined areas on a substrate which are provided at a second pitch different from the first pitch.

The invention provides a semiconductor device formed by bonding a semiconductor thin film piece formed on a first substrate and having a semiconductor element, to a second substrate, wherein the width of said semiconductor thin film piece is less than the chip width of said semiconductor device.

Because the semiconductor thin film piece formed on the first substrate is less than the chip width of the semiconductor device, the semiconductor thin film piece can be partially attached to the second substrate, and because the semiconductor thin film piece can be made very thin and narrow, the amount of the material for the semiconductor thin film piece which is formed for example of a compound semiconductor, which is more expensive than the silicon, and the semiconductor thin film pieces can be formed all at once, so that the yield rate can be improved.

The invention also provides a method of manufacturing a semiconductor device comprising the step of bonding a semiconductor thin film piece which has been separated from a first substrate to a second substrate, comprising:

a first step of selecting a first set of semiconductor thin film pieces from among the semiconductor thin film pieces formed on the first substrate, and bonding the selected semiconductor thin film pieces all at once to predetermined areas on the second substrate; and a second step of selecting a second set of semiconductor thin film pieces from the semiconductor thin film pieces which were not selected in the preceding bonding step, and bonding the selected semiconductor thin film pieces all at once to predetermined areas on another part of the same second substrate or on another second substrate.

With the above arrangement, a plurality of semiconductor thin film pieces formed on the first substrate at a first pitch can be bonded in predetermined areas on the second substrate which are provided at a second pitch different from the first pitch.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings:

FIG. 7A is a schematic perspective view showing the concept of transfer of semiconductor thin film pieces from a growth substrate to an IC substrate according to Embodiment 2 of the present invention;

FIG. 7B is a plan view showing an arrangement of semiconductor thin film pieces on an IC substrate;

FIG. 7C is a perspective view showing how the semiconductor thin film pieces of a thin film substrate are aligned with bonding layers on the IC substrate;

FIG. 8A is a schematic plan view of a GaAs substrate, or wafer, showing an arrangement of the semiconductor thin film pieces formed on the GaAs substrate;

FIG. 8B is a plan view of a Si substrate, or wafer, showing an arrangement of IC chip areas and semiconductor thin film pieces which are bonded in the respective IC chip areas;

DETAILED DESCRIPTION OF THE INVENTION

Figure 1:
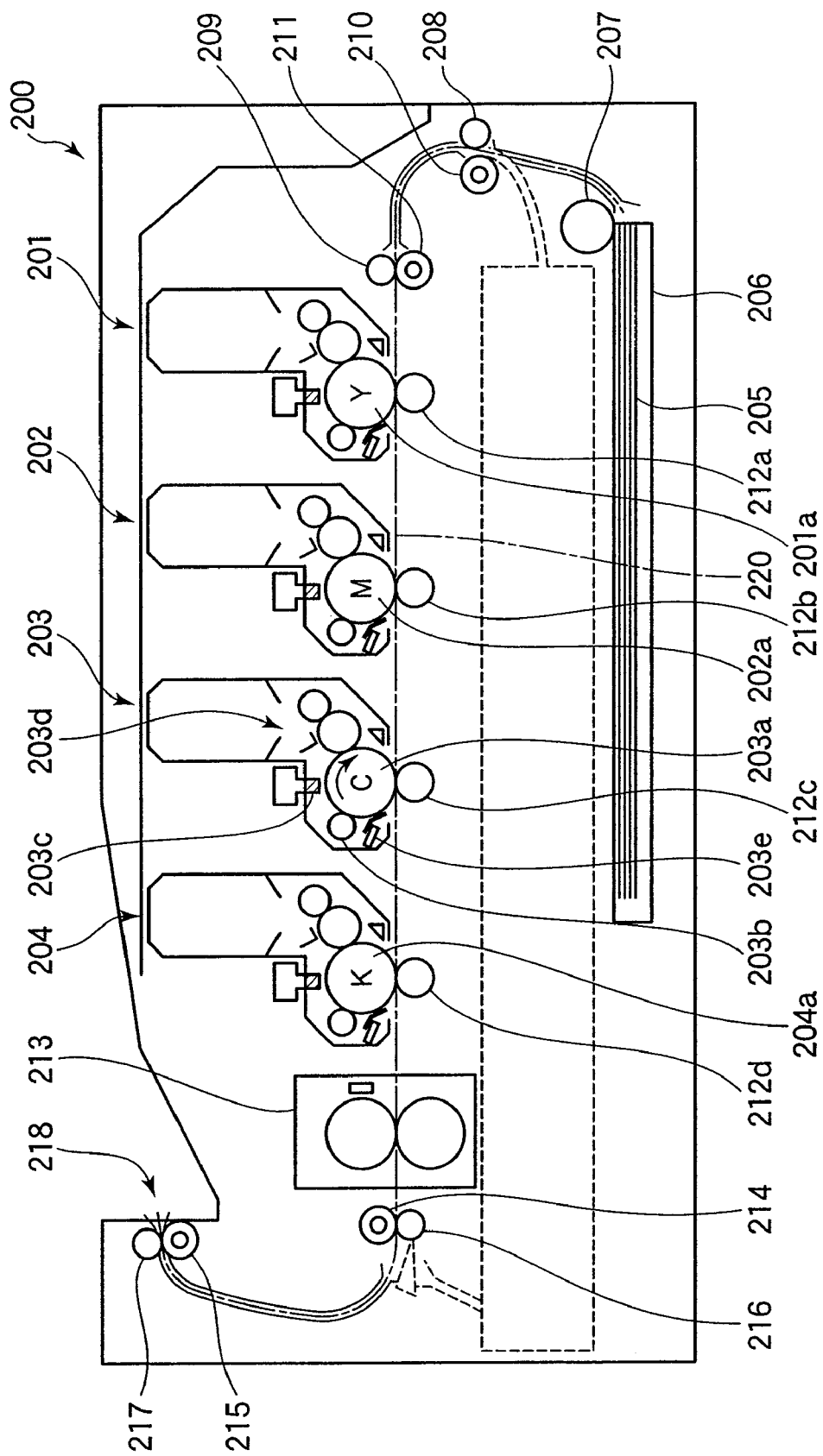
FIG. 1 is a schematic diagram showing of main components of an image-forming apparatus according to Embodiment 1 of this invention.

Embodiments of this invention will now be described referring to the drawings.

Embodiment 1

Embodiment 1 of the present invention is described with reference to FIGS. 1 to 6, and 8A.

FIG. 1 shows main components of an image-forming apparatus according to Embodiment 1.

The illustrated image-forming apparatus 200 is provided with four process units 201-204 which respectively form yellow, magenta, cyan and black images, and are disposed in series from the upstream side along the transport path 220 of a recording medium 205. The main components of these process units 201-204 and the structure of the transfer rollers 212a-212d associated with the process units 201-204 are identical with each other, so their internal construction will be described taking the cyan process unit 203 and the associated transfer roller 212c as an example.

In the process unit 203, a photosensitive drum 203a functioning as an image carrier is disposed such that it can rotate in the direction of the arrow. The photosensitive drum 203a is rotated by a drive unit and gears, not shown. A charging device 203b, an exposure device 203c, a developing device 203d, and a cleaning unit 203e are provided in that sequence around the photosensitive drum 203a from the upstream side of the rotation direction of the drum.

The charging device 203b supplies electricity to and thereby electrostatically charges the surface of the photosensitive drum 203a. The exposure device 203c forms an electrostatic latent image by selectively irradiating the surface of the photosensitive drum 203a with light. The exposure device 203c will be later described in further detail, referring to FIG. 2. The exposure device 203c uses an LED print head 100 to be described later.

The developing device 203d transports toner of a predetermined color (cyan, in this case) to the surface of the photosensitive drum 203a on which the electrostatic latent image is formed.

A transfer roller 212c is disposed to face the photosensitive drum 203a, and is used to transfer the toner image from the photosensitive drum 203a to the recording medium 205. The transfer roller 212c is formed of semiconducting rubber or the like. In order to cause toner on the photosensitive drum 203a to adhere to a recording medium 205, a potential difference is produced between the surface of the photosensitive drum 203a, and the surface of the transfer roller 212c.

The cleaning unit 203e removes toner remaining on the surface of the photosensitive drum 203a.

The image-forming apparatus 200 has, in its lower part, a paper cassette 206 which accommodates a stack of the recording medium 205 such as paper, and above this, a hopping roller 207 which separates the recording medium 205 one sheet at a time and transports it. Resist rollers 210, 211 and pinch rollers 208, 209 are disposed downstream (in the direction of the recording medium transport direction) of this hopping roller 207, and correct the skew of the recording medium 205 by gripping the recording medium 205, and transport it to the process units 201-204. The hopping roller 207 and resist rollers 210, 211 are driven in unison by a drive unit, not shown.

The recording medium 205 passes the first process unit 201, being gripped by the photosensitive drum 201a and transfer roller 212a. Similarly, the recording medium 205 passes successively through the process units 202 to 204.

While the recording medium passes the process units 201 to 204, electrostatic latent images are formed by the exposure devices 201c-204c, and are developed by the developing devices 201d-204d, and the toner images of the respective colors are successively transferred and superimposed on the recording medium, thereby a color image is formed on the recording medium.

A fixing unit 213 comprises a heating roller and a backup roller, and fixes toner having been transferred to the recording medium 205, by pressure and heat.

Ejection unit comprising ejection rollers 214, 215 and pinch rollers 216, 217, which grip the recording medium 205 ejected from the fixing device 213, and transport it to a recording medium stacker unit 218 outside the image-forming apparatus 200. The eject rollers 214, 215 are rotated by a drive unit, not shown.

As described above, the image-forming apparatus of this embodiment uses the LED head which is later described in detail, so that it has a high space utilization efficiency, offers high-quality images and can be expected to reduce manufacturing costs.

Figure 2:
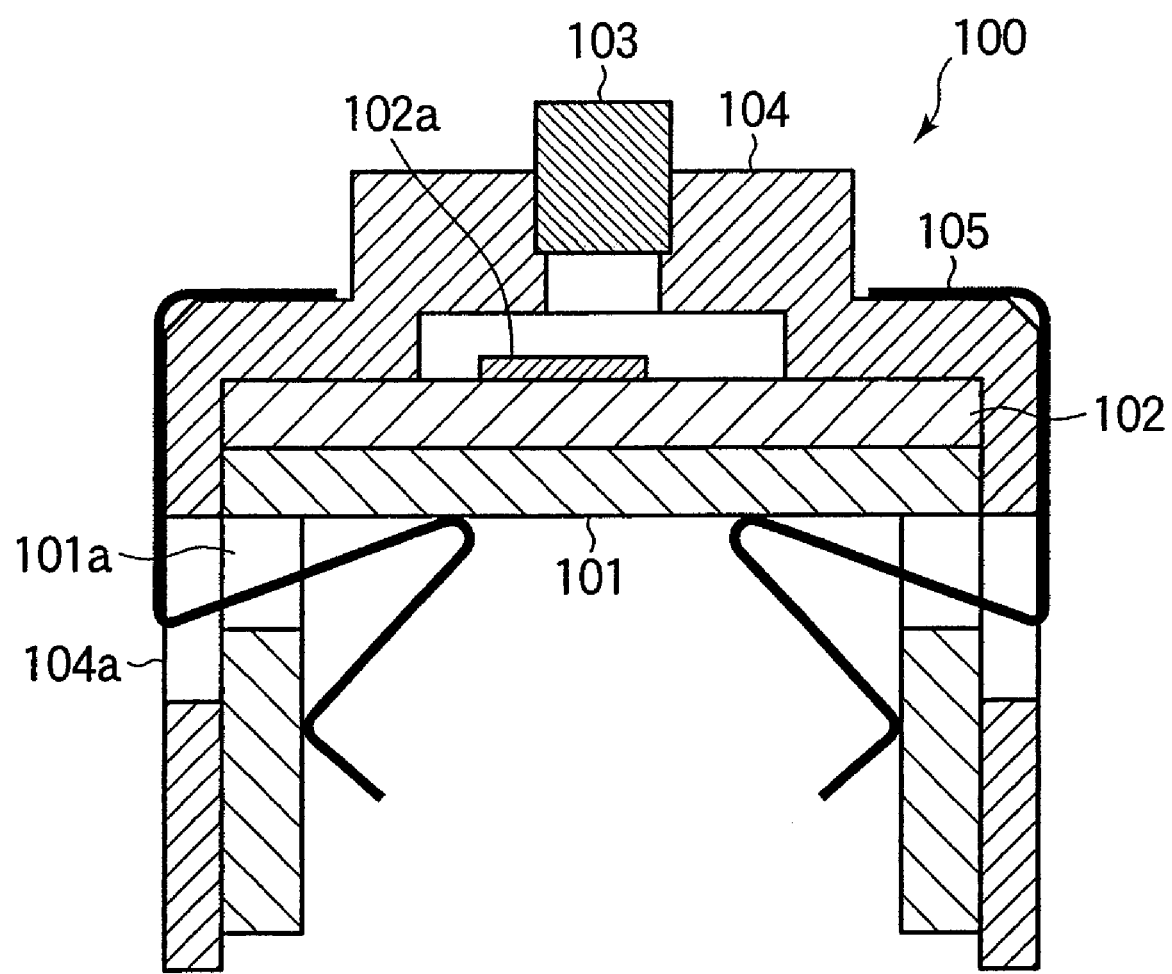
FIG. 2 is a sectional view showing main components of an LED print head which is used as an exposure device in the image-forming apparatus shown in FIG. 1.

FIG. 2 shows the main part of the LED print head forming the exposure device of FIG. 1.

As illustrated, this LED print head 100 includes an LED unit 102 mounted and fixed on a base member 101. This LED unit 102 comprises a plurality of LED/driver IC compound chips mounted side by side in a straight line. Each LED/driver IC compound chip comprises a driver IC chip and a light-emitting unit 102a in the form of a semiconductor thin film (also called an "epifilm" or "epitaxial film" bonded to the driver IC chip.

A rod lens array 103 which functions as an optical element for collimating light emitted by light-emitting parts, is disposed above the light-emitting parts of the light-emitting unit 102a. This rod lens array 103 has a multitude of rod-shaped optical lenses arranged along light-emitting parts arranged in a line in the light-emitting unit 102a, and is held in a predetermined position by a lens holder 104.

As illustrated, the lens holder 104 is formed so as to cover the base member 101 and LED unit 102. The base member 101, LED unit 102 and lens holder 104 are clamped together by a clamp 105, extending through openings 101a and 104a formed in the base member 101 and lens holder 104.

Light emitted by the LED unit 102 is therefore irradiated to a predetermined external member via the rod lens array 103. In this way, the LED print head 100 may for example be used as an exposure device for an electrophotographic printer, electrophotographic copier, or the like.

Figure 3:
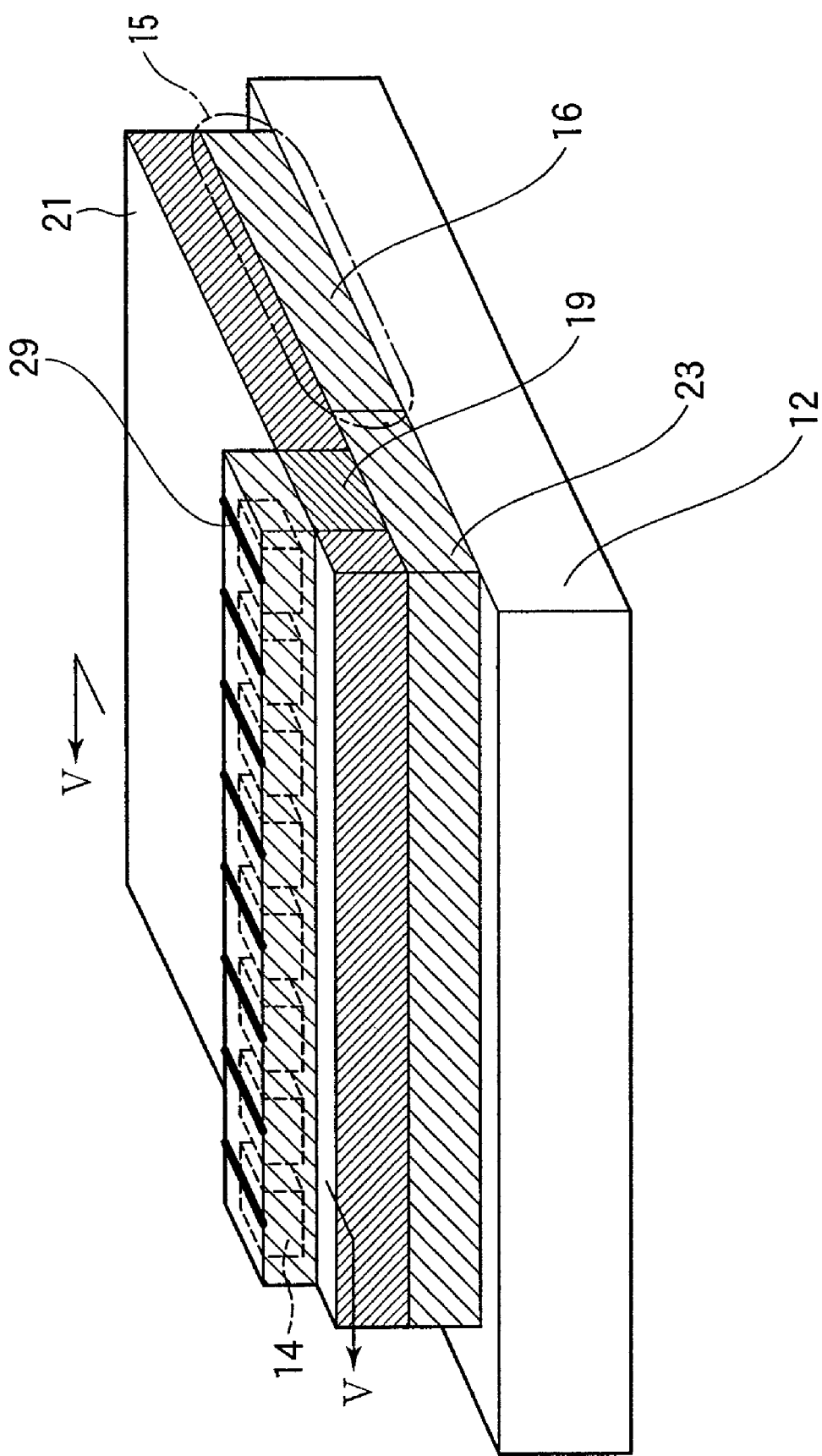
FIG. 3 is a perspective view showing an LED unit according to Embodiment 1.
Figure 4:
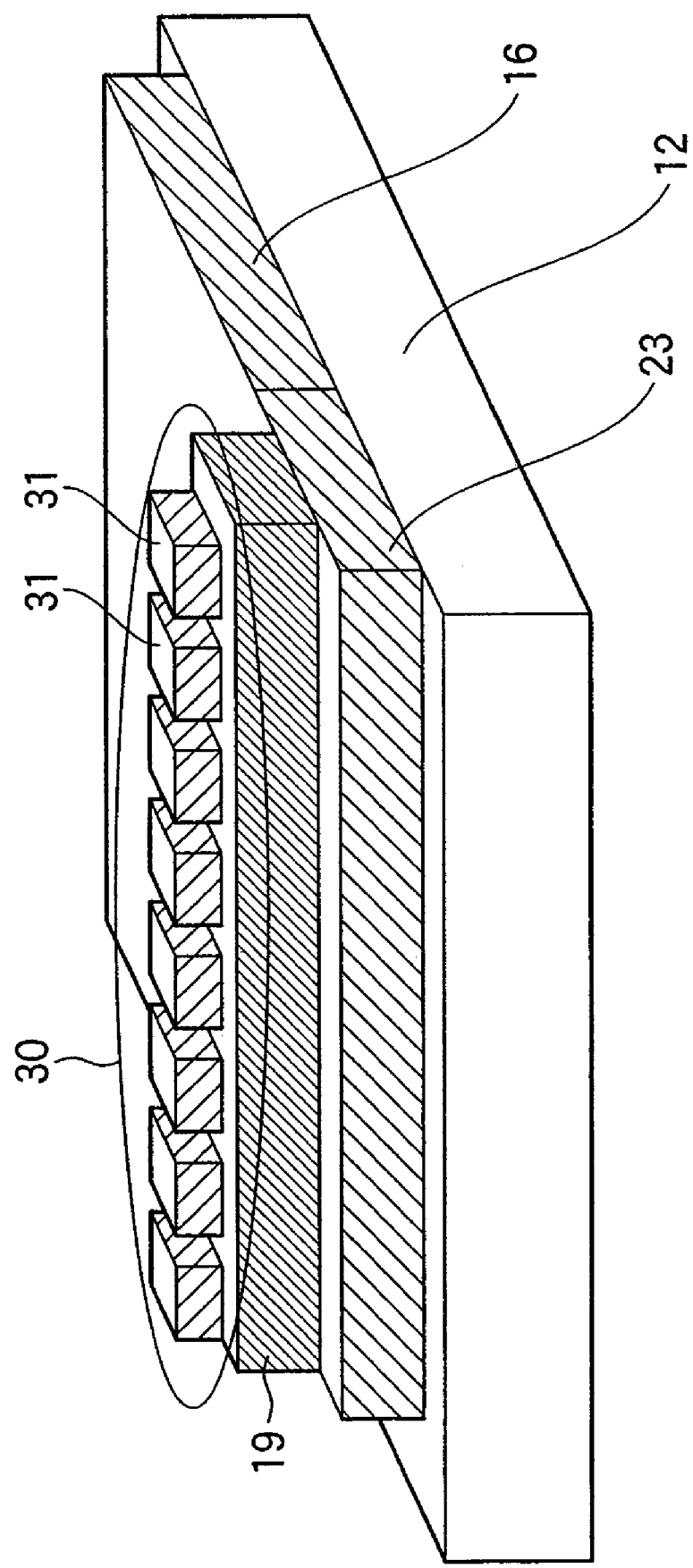
FIG. 4 is a perspective view showing a state during a process step for production of the LED unit of Embodiment 1.
Figure 5:
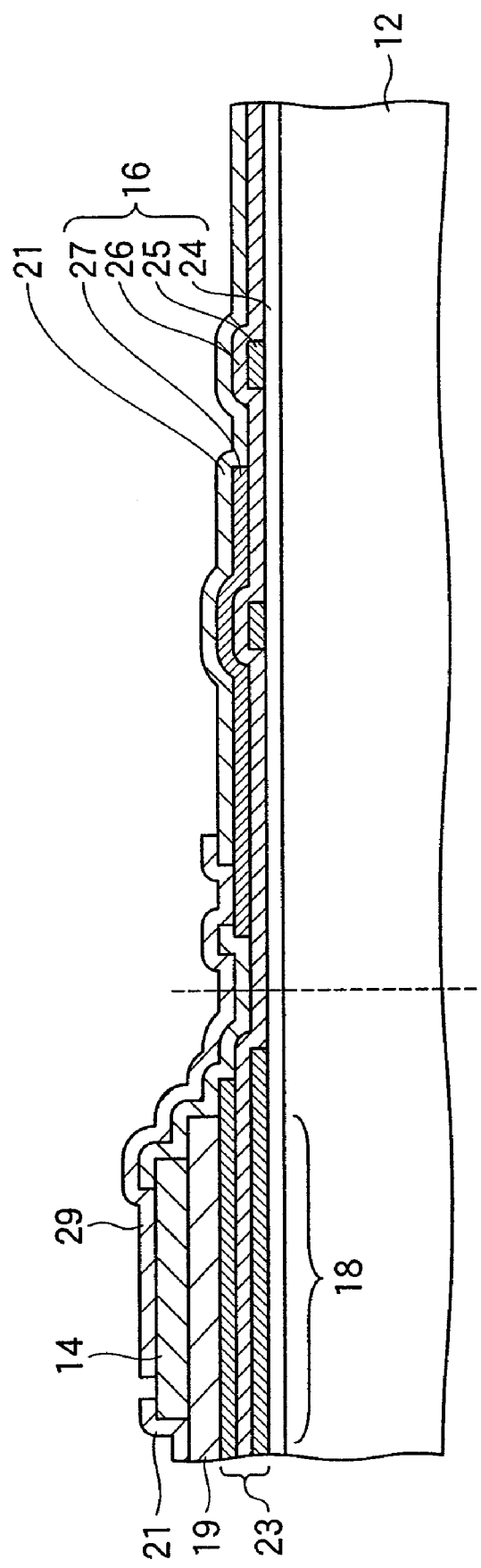
FIG. 5 is a sectional view along line V-V in FIG. 3.

FIG. 3 is a perspective view showing the general construction of a semiconductor device part of the LED unit 102 of FIG. 2. FIG. 4 is a perspective view showing the general construction during manufacture of the semiconductor element shown in FIG. 3. FIG. 5 is a sectional view through a V-V in FIG. 3. FIG. 5 is essentially a schematic view which conceptually shows the film structure of the area to which the semiconductor thin film is joined or bonded, and the structure of a height adjusting layer, or the structure of an interconnection which connects individual interconnections of semiconductor elements of the semiconductor thin film and ICs. The detailed structure of the IC area has been omitted or simplified as long as the relation in the film structure of the area to which the semiconductor thin film is bonded, the structure of the height adjusting layer, the structure of the interconnection which connects individual interconnections of semiconductor elements of the semiconductor thin film and ICs, and the structure of the IC area is clear.

As illustrated, the LED unit comprises a Si substrate 12 to which a semiconductor thin film piece 14 formed on a GaAs substrate, not shown in FIG. 3, which is suitable for forming (e.g., epitaxially growing) the semiconductor thin film pieces thereon, is transferred. As the GaAs substrate is used for epitaxillay growing semiconductor thin film on it, it is called a "growth substrate" or a "first substrate." The Si substrate is called a "second substrate."

The Si substrate 12 (the entire wafer) may have a plurality of IC (integrated circuit) chip areas 33 as shown in FIG. 8B, and a plurality of semiconductor thin film pieces may be transferred to the respective IC chip areas 33 on the Si substrate 12, and the Si substrate 12 may be later diced into individual chips. However, the following description is made mostly with respect to one chip area 33.

Formed in each IC chip area 33 on the Si substrate 12 is an IC 15, which may comprise analog and/or digital circuits formed of CMOS transistors and the like. The IC 15 in the illustrated example is a driver IC for driving LED units. The IC includes an IC interconnection part (multilayer interconnection part) 16. Part of the IC 15 within the Si substrate 12 is located below the interconnection part 16, but are not specifically illustrated as such.

The semiconductor thin film 14 is formed on the growth substrate and comprises compound semiconductor epitaxial layers having p-n junctions forming light-emitting elements.

The material used to form the growth substrate such as the GaAs substrate, is far more expensive than the material used to form the second substrate such as the Si substrate or the like. By repeatedly using the same growth substrate for formation of the semiconductor thin film pieces and transferring them to a plurality of different second substrates, the cost of mass-producing the LED units can be lowered.

A bonding layer 19 is a conducting layer formed of a metal layer or the like which is provided in a bonding area 18 to which the semiconductor thin film piece 14 is transferred. The bonding layer 19 forms an electrical connection with a semiconductor thin film piece when the semiconductor thin film piece is provided with a common electrode (or contact) on its lower or rear surface. The bonding layer 19 also forms an electrical connection with a common electrode in the IC chip area 33 in the Si substrate 12. An interlayer insulation film 21 insulates the IC interconnection part 16, a height adjusting layer 23 or the bonding layer 19. The height adjusting layer 23 is provided in the bonding area 18 to which the semiconductor thin film piece 14 is to be transferred, in order to adjust the height of the top surface of the bonding layer 19. In the illustrated example (FIG. 5), the height adjusting layer 23 is formed by the interconnection layers 25, 27 and the interlayer insulation film 26.

In order to facilitate bonding of the semiconductor thin film 14, the top surface of the bonding layer 19 is preferably higher than the highest part of the IC interconnection part 16 or any part other than the bonding layer 19. The difference between the height of the bonding layer 19 and the highest part of the IC interconnection part 16 is preferably 1 μm-10 μm. If this height difference is too large, it is difficult to form interconnections, and if it is too small, a semiconductor thin film piece 14 which is not to be transferred during selective bonding of the semiconductor thin film pieces 14 may come in contact with the part other than the bonding layer 19. A sufficient height of the bonding layer 19 can also be obtained by making the bonding layer 19 thicker. But if the height adjusting layer 23 is provided, it is unnecessary to make the bonding layer 19 thicker.

When the bonding layer 19 is formed from a metal, a single layer or a laminate comprising a noble metal such as gold, palladium, Ti—Pt—Au laminate or AuGe—Ni—Au laminate is preferably used. Metals including noble metals are costly, but by providing the height adjusting layer 23, the bonding layer 19 can be made thin, so the cost of providing the bonding layer 19 can be reduced. Further, if the bonding layer 19 can be made thin, the time for forming the layer can be reduced, so the cost of forming the layer can also be reduced. The bonding layer 19 may also be formed from Al or copper.

The height adjusting layer 23 can for example be formed from a glass layer, organic film layer or nitride film layer in a step separate from the step of forming the aforesaid layers. Alternatively, the height adjusting layer 23 can be formed by leaving the interlayer insulation film or metal layers 25 and 27, while the IC is formed. In this case, the height adjusting layers 23 can be formed during steps for forming the IC, and as it is unnecessary to form a height adjustment layer separately from these steps, the number of manufacturing steps can be reduced. The respective layers can be formed in such a manner that the more upward layers have smaller surface areas, so that they as a whole are terraced, without having a large step difference (or abrupt height change). Accordingly, when an interconnection layer is subsequently formed thereupon, occurrence of breaks in the interconnection layer can be prevented. Needless to say, where a greater height is desired, a bonding layer 19 may be provided in addition to the metal layers 25 and 27, and the interlayer insulation film 26.

An individual interconnection 29 connects the semiconductor thin film piece 14 and the interconnection layer 27 in the IC interconnection part 16. The semiconductor thin film piece 14 is separated from the GaAs substrate and transferred to the Si substrate 12. The semiconductor thin film piece 14 has semiconductor elements formed in part or the whole area thereof, and includes a row 30 of a plurality of semiconductor elements 31. An interlayer insulation film 24 comprises an insulation layer of SiO2, Si3N4, or the like, and insulates the Si substrate 12 from the interconnection layer 25. The interconnection layer 25 is an interconnection layer of the integrated circuit and is formed on the interlayer insulation film 24.

The interlayer insulation film 26 is formed from SiO2 or the like, and is formed on the interconnection layer 25 to insulate the lower interconnection layer 25 from the upper interconnection layer 27. The interconnection layer 27 is an interconnection layer of the integrated circuit and is formed on the interlayer insulation film 26. The semiconductor elements 31 of the row 30 may for example comprise light-emitting elements formed in the semiconductor thin film piece 14.

The semiconductor thin film piece 14 is stuck on the bonding layers 19 formed as described above. The top surface of the bonding layer 19 is formed higher than the other parts of the Si substrate 12 as described above, so when the semiconductor thin film piece 14 is stuck on it from above, the semiconductor thin film piece 14 will not come in contact with other parts of the Si substrate 12. Therefore, it is easy to stick the semiconductor thin film piece 14.

An interlayer insulation film 21 is also formed on the semiconductor thin film piece 14 excepting parts connected to interconnections, and the interconnection layer 29 which connects the semiconductor thin film piece 14 and interconnection layer 27 in the interconnection part 16 is formed thereupon. The interconnection layer 29 is connected to the top surface of the semiconductor thin film piece 14 via throughholes provided in the interlayer insulation film 21, and is connected with the interconnection layer 27 in the interconnection part 16.

In the example described above, the bonding layer 19 is formed of metal. However for example, if a positive electrode and negative electrode (or ground electrode) of the semiconductor thin film piece are both led out from the top surface of the semiconductor thin film 14, the height may for example be adjusted by providing a bonding layer which is formed of an insulation layer or a semiconductor layer instead of the aforesaid metal layer. This insulation layer may be a glass layer, silicon nitride layer, PSG (phosphosilicate glass) layer or resin layer. The bonding layer may still alternatively be comprised of a laminate of a metal layer and an insulation film layer. In such a case, the uppermost layer is preferably made of metal. The bonding layer may still alternatively be comprised of an interconnection layer.

In the example shown in FIG. 5, the interconnection layers comprises two layers (25 and 27), but if it is required to provide three or more interconnection layers, one or more combinations each comprising an interlayer insulation film and an interconnection layer, not shown, may be additionally laminated as required on the interconnection layer 27.

Figure 6:
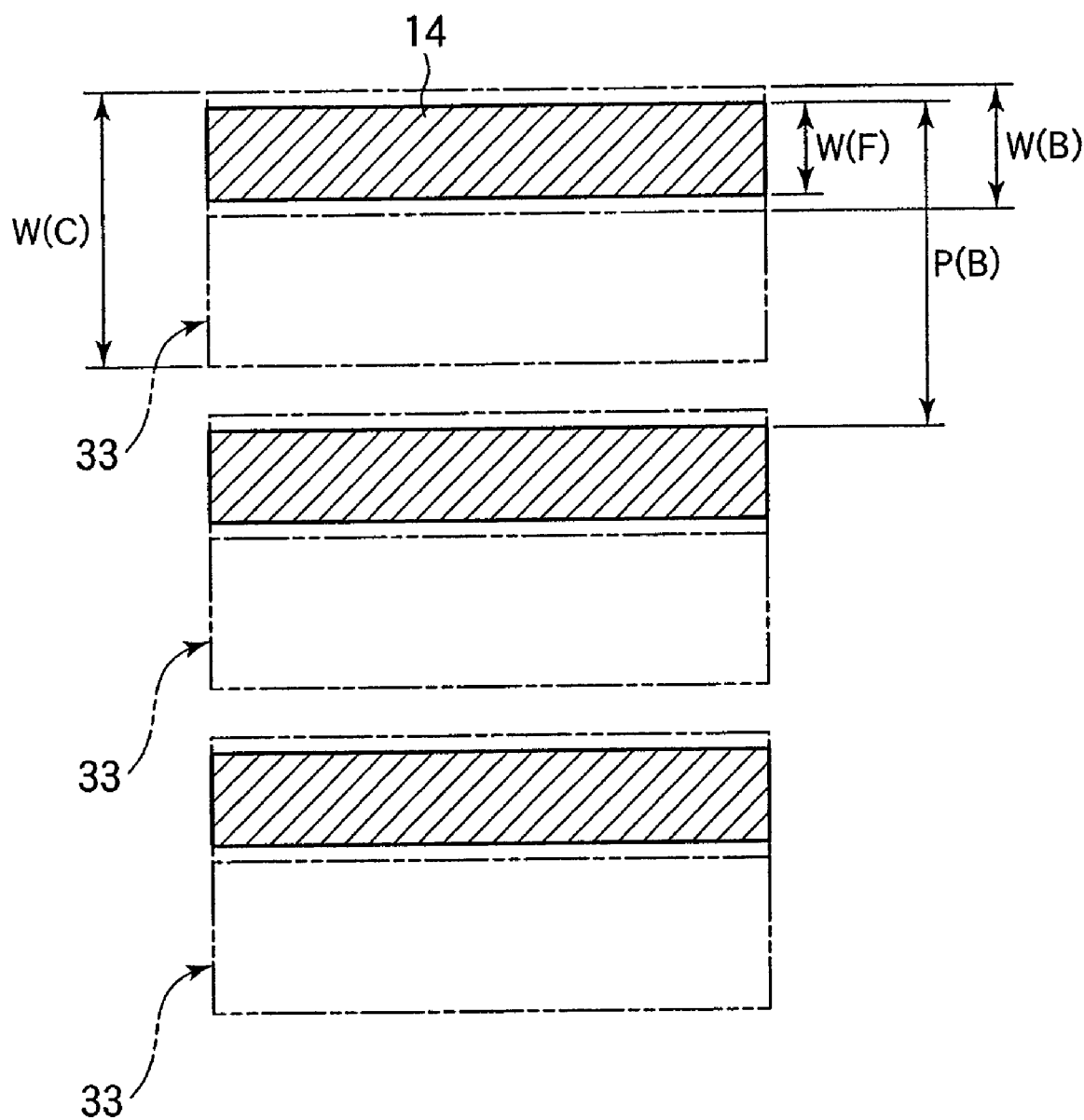
FIG. 6 is a schematic plan view showing an arrangement of IC chip areas on an IC substrate.

As was described with reference to FIG. 8B, the Si substrate 12 (the entire wafer) has a plurality of IC chip areas 33. FIG. 6 shows only three of such IC chip areas 33, and is used to describe the relationship between the dimensions of various members and parts. In FIG. 6, W(C) denotes the device width W(C), which is the width of the semiconductor device to be formed by combining the semiconductor thin film 14 and the drive circuit formed on the Si substrate 12, and dicing the Si substrate 12 into individual chips. This width is also the width of an area (called "IC chip area" or "driver IC chip area") which will become a chip after dicing the Si substrate 12.

W(B) denotes the bonding area width which is the width of the bonding area 18 provided for bonding the semiconductor thin film piece 14 on the Si substrate 12.

W(F) denotes the semiconductor thin film piece width which is the width of the semiconductor thin film piece 14 bonded on the Si substrate 12.

P(B) denotes the arrangement pitch P(B) at which the bonding areas 18 are provided on the Si substrate 12.

The bonding area width W(B) is equal to the sum of the semiconductor thin film piece width W(F) and a margin accommodating positioning errors during sticking of the semiconductor thin film piece 14.

As shown in FIG. 6, the bonding area width W(B) is less than the IC chip width W(C). The width W(F) of the semiconductor thin film piece 14 bonded to the bonding layers 19 is less than the bonding area width W(B). Also, the arrangement pitch P(B) of the bonding areas is larger than the IC chip width W(C). In other words, the following relation holds:

$$W(C) \geqq W(B) \geqq W(F)$$

In the embodiment described above, a semiconductor thin film piece including light-emitting elements is formed on a GaAs substrate, and the semiconductor thin film piece is bonded in a driver IC chip area formed on a Si substrate. However, the semiconductor device of this invention is not limited to the situation where a semiconductor thin film piece formed on a GaAs substrate is transferred into a driver IC chip area formed on a Si substrate.

The material of the semiconductor thin film piece formed on the growth substrate may be other than GaAs, but may be another compound semiconductor, for example semiconductor containing InP, AlGaInP, InGaAsP, GaN, InGaN, AlGaN, or the like, or it may be an inorganic semiconductor such as monocrystalline Si or polycrystalline Si. Also, the growth substrate may, depending on the desired semiconductor thin film piece material, be formed of a semiconductor other than GaAs, e.g., InP, GaP, sapphire or Si. Likewise, the second substrate may be formed of a material other than Si, such as glass, ceramics, metal, plastic or quartz. The semiconductor element may further be an element other than a light-emitting element, such as for example a light-receiving element, drive element, memory element, computing element or piezoelectric element.

In this way, according to the semiconductor device of Embodiment 1, a height adjusting layer formed simultaneously in the driver IC chip-forming step can be provided in the area to which the semiconductor thin film piece is bonded. Therefore, the material used for making the top surface of the bonding layer higher than the surroundings can be reduced, the thickness of this material can be reduced, the usage amount of costly material used for the bonding layer can be reduced so costs can be reduced, and the time for forming the bonding layer can be shortened.

In the embodiment described, the integrated circuits are not formed in the areas for bonding the semiconductor thin film pieces. With such an arrangement, the areas for bonding the semiconductor thin film pieces can be made flat, and the semicondcutor thin film pieces can be bonded to the Si substrate with a great strength.

It is possible to formed the integrated circuits below the areas for bonding the semiconductor thin film pieces to improve the utilization efficiency of the Si substrate. In this case, it is necessary to add a surface planarization layer of metal, an insulating material, or the like, and conduct surface planarization by for example etching the convexes and concaves on the surface planarization layer.

Embodiment 2

Embodiment 2 of this invention will now be described with reference to FIGS. 7A to 26. FIG. 7A shows a growth substrate, which for example is a GaAs substrate 35 on which semiconductor thin film pieces 14 are formed and from which the semiconductor thin film pieces 14 are separated, and a second substrate, which for example is a Si substrate 12 to which the semiconductor thin film pieces are transferred. Although the GaAs and Si substrates 35 and 12 are shown to have the same diameter, their diameters may be different from each other.

The Si substrate has a plurality of IC chip areas 33 as shown in FIG. 7B. In FIG. 7B, only two IC chip areas 33 are shown, but the entire wafer has much more IC chip areas 33, as is better illustrated in FIG. 8B. The semiconductor thin film pieces 14 are to be bonded in respective IC chip areas 33.

For the purpose of facilitating handling during transfer of the semiconductor thin film pieces from the GaAs substrate 35 to the Si substrate 12, the semiconductor thin film pieces 14 are respectively supported by individual supports 37 associated with the respective semiconductor thin film pieces 14, and the individual supports 37 in turn are supported and connected by a connection support 39, as shown in FIG. 7C. The assembly of the semiconductor thin film pieces 14, the individual supports 37 and the connection support 39 is called a thin film substrate 61.

Before the semiconductor thin film pieces 14 are bonded, an interconnection part 16, a bonding layer 19, and a height adjusting layer 23 are formed in each of the IC chip areas 33 on the Si substrate 12, as is also shown in FIG. 7C. The Si substrate 12 with the interconnection parts 16, the bonding layers 19, and the height adjusting layer 23 having been formed in respective IC chip areas 33 is called an IC substrate 13. The bonding layer 19 is formed in the bonding area 18.

The semiconductor thin film pieces may be formed of a semiconductor epitaxial layers. The semiconductor epitaxial layers may for example comprise a pn junction part forming a light-emitting element.

The process of forming the thin film substrate 61 will be explained in detail with reference to FIGS. 12 to 16, and FIG. 22, as well as FIG. 8A.

On the GaAs substrate 35, the semiconductor thin film pieces 14 are formed at positions disposed at an equal interval or pitch. When the semiconductor thin film pieces 14 are separated from the GaAs substrate 35, they are supported by the individual supports 37 and the connection support 39. The pitch of the semiconductor thin film pieces 14 in the state in which they are supported by the individual and connection supports 37 and 39 is the same as the pitch at which they were positioned on the GaAs substrate 35.

The individual supports 37 are for example formed of a photosensitive material. During the process of forming the individual supports 37, a continuous layer is first formed, and the continuous layer is then patterned for division into individual supports, by means of photolithography. The connection support 39 is for example a glass substrate made of quartz glass. The connection support 39 preferably has UV light transmitting properties, for the reason that will later become apparent. The surface of the connection support 39 which connects and supports the individual supports 37 is flat, and the thickness or heights (dimension in the direction normal to the surfaces of the thin film pieces) of the individual supports 37 are identical with each other. As a result, the dimensions in the height direction of the semiconductor thin film pieces 14 can be made uniform, and the semiconductor thin film piece positioned in each chip area 33 can be selectively brought into contact only with the top surface of the bonding layer 19 which is at a higher position than the surface of the multilayer interconnection part 16 (or any other part in the chip area 33).

Figure 9:
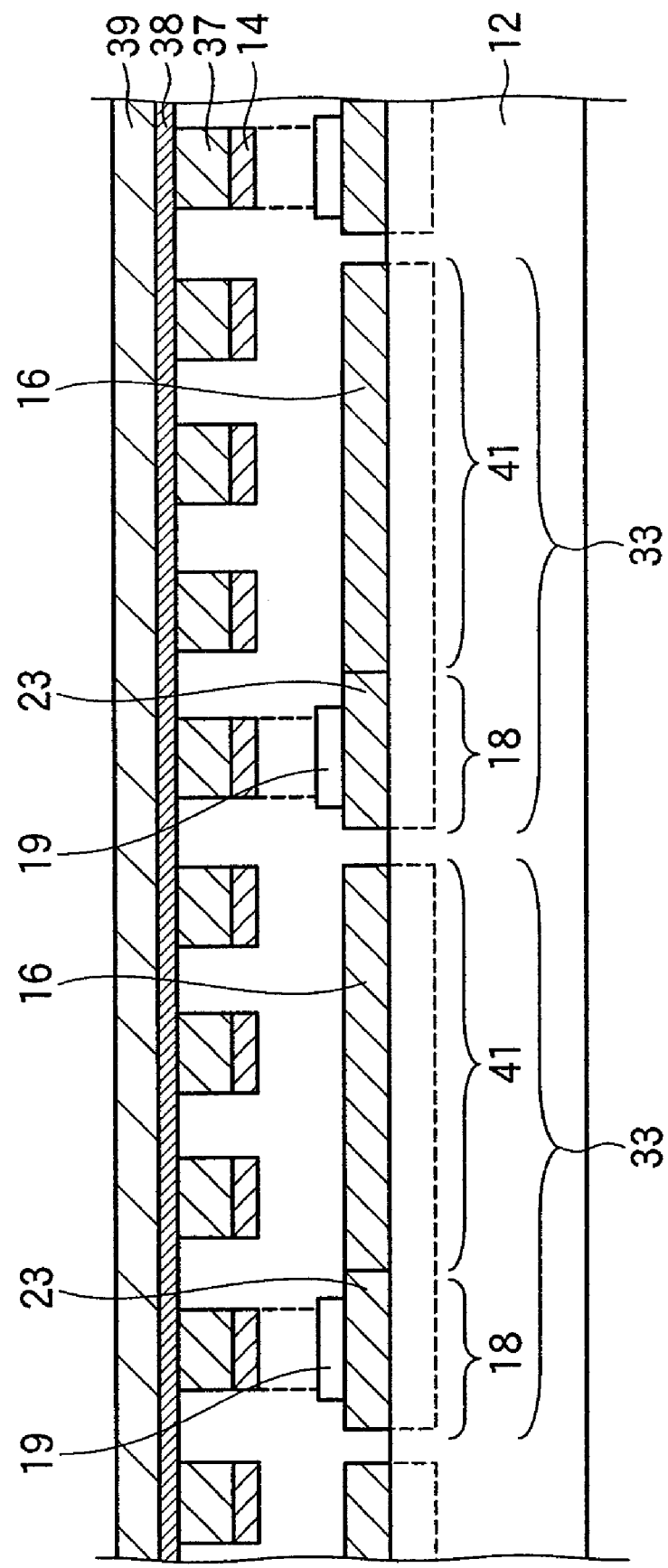
FIG. 9 is a sectional view showing a state in which every fourth semiconductor thin film piece supported by a connection support is aligned with a bonding layer.

Provided between the individual supports 37 and connection support 39 is a tacky-adhesive layer 38 (as shown in FIG. 9) with its tacky-adhesive force capable of being changed by heat or light, or an attachment surface with its attachment state capable of being controlled by electrical or magnetic attraction, or by an attraction due to a pressure difference.

When the semiconductor thin film pieces 14 are transferred to the Si substrate 12, a plurality of semiconductor thin film pieces 14 aligned with the bonding layers 19 are selectively transferred all at once. FIG. 7C show two of the semiconductor thin film pieces which are transferred simultaneously.

FIG. 8A is a schematic plan view of the GaAs substrate 35, showing an example of arrangement of the semiconductor thin film pieces on the GaAs substrate 35. As illustrated, the semiconductor thin film pieces are arranged at an equal interval or pitch P1 on the GaAs substrate 35. FIG. 8B is a schematic plan view of the Si substrate 12, showing an example of arrangement of the IC chip areas 33 in which the semiconductor thin film pieces 14 are transferred. As illustrated, the IC chip areas 33 are arranged at an equal interval or pitch P2 on the Si substrate 12. The arrangement pitch P2 corresponds to the arrangement pitch P(B) in FIG. 6. The relation between P1 and P2 satisfies the following equation (1):

$$P2=a*P1 \qquad (1)$$

Here, a is an integer equal to or greater than 1.

Figure 10:
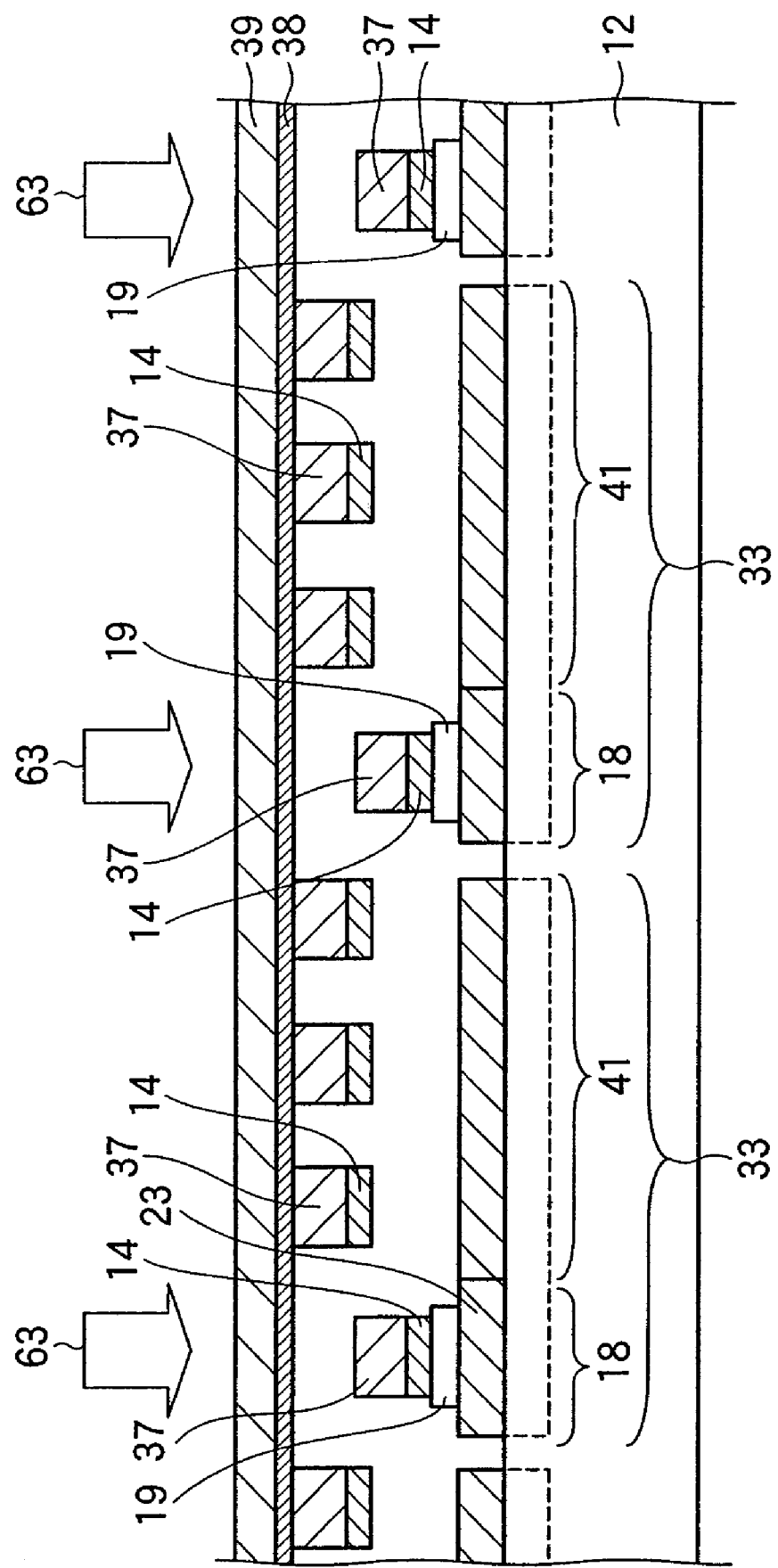
FIG. 10 is a sectional view showing a state in which the every fourth semiconductor thin film piece has been bonded to the bonding layer, while other semiconductor thin film pieces are lifted together with a connection support.
Figure 11:
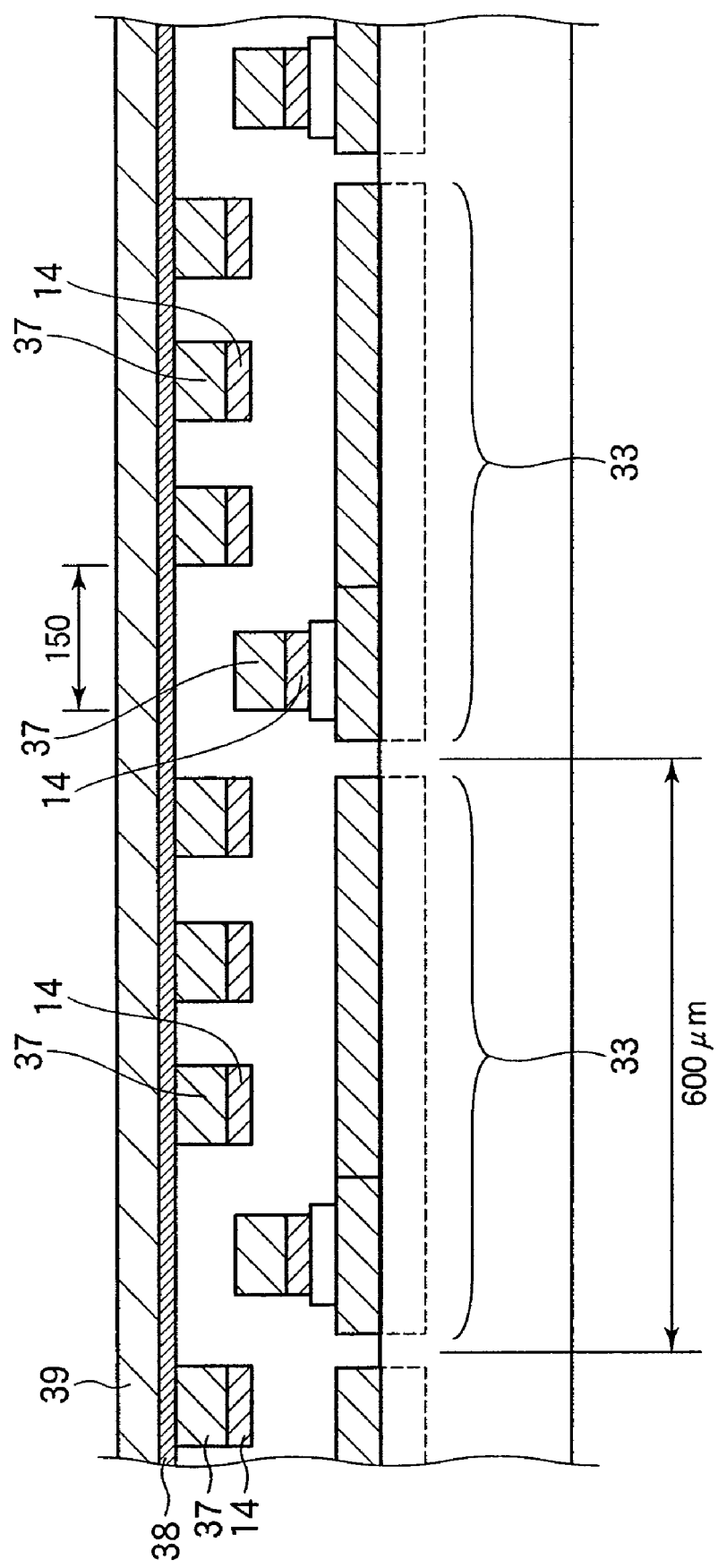
FIG. 11 is a sectional view showing numerical examples of the arrangement pitch of the semiconductor thin film pieces on the connection support, and the arrangement pitch of the bonding layers on the IC substrate.

FIGS. 9 to 11 are sectional views showing the steps for transferring the semiconductor thin film pieces into the respective bonding areas 18 disposed at the arrangement pitch P2 of FIG. 8. In FIGS. 9 to 11, it is assumed that a set of semiconductor thin film pieces 14 consisting of every fourth semiconductor thin film conform to the arrangement pitch of the bonding areas 18 in the IC substrate 13, and every fourth semiconductor thin film is bonded simultaneously, instead of every third semiconductor thin film piece as in FIG. 7.

As shown in FIG. 9, an IC substrate 13 having a plurality of IC chip areas 33 in each of which a driver IC including the IC interconnection part 16 has been formed in an IC area 41, and a height adjusting layer 23 has been formed adjacent to the IC area 41, and a bonding layer 19 has been formed on the height adjusting layer 23, is prepared in advance. The bonding layer 19 may be made from metal.

The top surface of the bonding layer 19 from the Si substrate 12 is arranged to be higher than any other member in the IC area 41.

As was described with reference to FIG. 7C, the connection support 39 connects and supports the individual supports 37, and may for example be a glass substrate of for example quartz glass or the like having UV light transmitting properties. The surface of the connection support 39 which connects and supports the individual supports 37 is flat, and the thickness dimensions of the individual supports 37 are made uniform. As a result, the semiconductor thin film pieces 14 are supported so that their heights are the same with each other, i.e., their bottom surfaces (the surfaces which are made to face the Si substrate for bonding with the Si substrate 12) are flush with each other. Accordingly, the semiconductor thin film pieces 14 can be selectively brought into contact only with the top surfaces of the bonding layers 19 which are at a higher position than the surface of the members in the IC area 41 (or any other parts in the chip areas 33. A tacky-adhesive layer 38 may for example be a photocuring tacky-adhesive layer which sticks the individual supports 37 and connection support 39.

As shown in FIGS. 9 to 11, those of the semiconductor thin film pieces 14 which are in alignment with the bonding areas 18 are selectively bonded to the bonding layers 19 on the Si substrate 12. In the illustrated example, a set of semiconductor thin film pieces 14 consisting of every fourth semiconductor thin film piece conform to the arrangement pitch of the bonding areas 18, and every fourth semiconductor thin film piece 14 is aligned with a bonding area 18. Those of the semiconductor thin film pieces 14 which are not aligned with the bonding areas 18 are not bonded to the bonding layers 19. FIG. 10 shows a state where only the every fourth semiconductor thin film piece 14 has been bonded to the corresponding bonding layer 19. The selective bonding is achieved due to the difference in height between the bonding layer 19 and the members in the surrounding areas, including the IC interconnection part 16.

In addition, UV light may be selectively irradiated from the side of the connection support 39 (which has UV light transmitting properties) to the tacky-adhesive layer 38 in the areas aligned with the bonding areas 18. The tacky-adhesive force in the tacky-adhesive layer 38 in the areas irradiated by the UV light, is weakened. When this occurs, the bonding strength between the bonding layers 19 and semiconductor thin film pieces 14 becomes larger than the strength with which the semiconductor thin film pieces 14 and the individual supports 37 are stuck to the connection support 39, in the areas where the tacky-adhesive force in the tacky-adhesive layer 38 has been weakened, so the semiconductor thin film pieces 14 will be transferred to the bonding layers 19.

FIG. 11 shows examples of arrangement pitch of the semiconductor thin film pieces 14 supported by the individual and connection supports 37 and 39, and arrangement pitch of the bonding areas 18 on the Si substrate 12. In the illustrated example, the arrangement pitch P1 of the semiconductor thin film pieces 14 is 150 μm, and the pitch P2 of the bonding areas 18 in which the semiconductor thin film pieces 14 are bonded is 600 μm, the aforesaid equation (1) becomes:

$$P2=4*P1.$$

The process of manufacturing the semiconductor device briefly described above will now be described in further detail with reference to FIGS. 12 to 19. In the following description referring to FIGS. 12 to 19, it is assumed that a set of semiconductor thin film pieces 14 consisting of every third semiconductor thin film conform to the arrangement pitch of the bonding areas 18 in the IC substrate 13, and every third semiconductor thin film is bonded simultaneously, instead of every fourth semiconductor thin film piece as in FIGS. 9 to 11.

Figure 12:
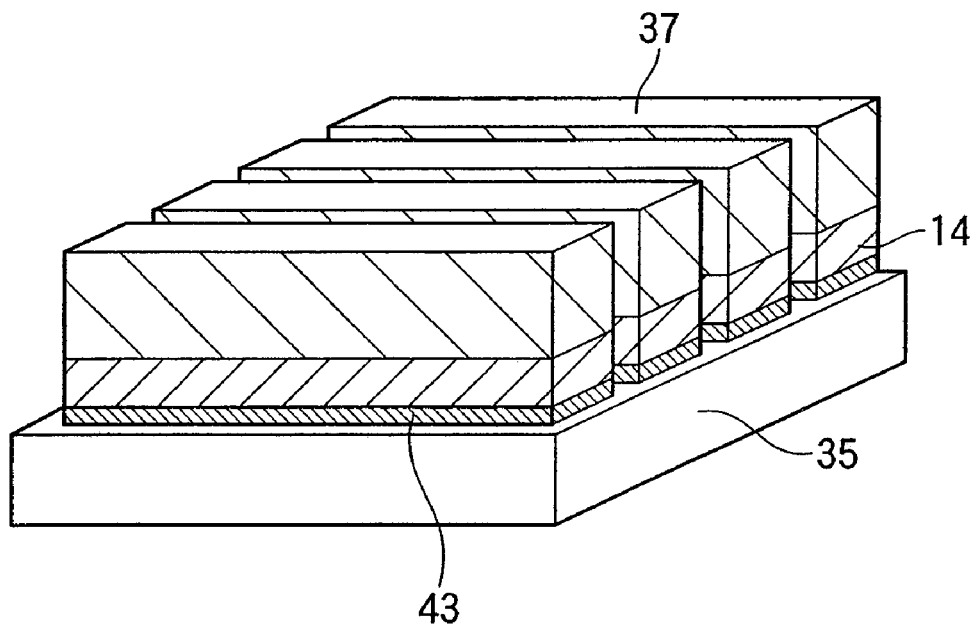
FIG. 12 is a perspective view showing semiconductor thin film pieces and individual supports formed on the growth substrate.

FIG. 12 is a partially enlarged, perspective view of the semiconductor thin film pieces 14 formed on the GaAs substrate 35 and the individual supports 37 formed on the semiconductor thin film pieces 14. FIG. 12 also shows sacrifice layers 43, between the semiconductor thin film pieces 14, and the GaAs substrate 35. The sacrifice layers 43, the semiconductor thin film pieces 14 and the individual supports 37 are formed in a laminar construction on the GaAs substrate 35. The sacrifice layers 43 are used for separating semiconductor thin film pieces 14 from the GaAs substrate 35.

Figure 22:
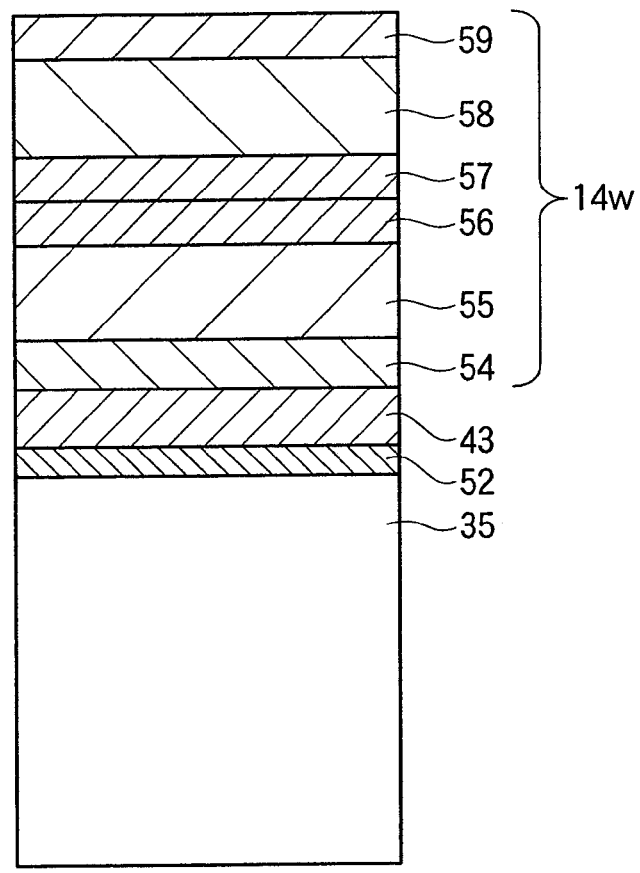
FIG. 22 is a sectional view showing an example of layer construction of a semiconductor thin film piece.

An example of the layer construction of each semiconductor thin film piece 14 is shown in detail in FIG. 22.

The semiconductor thin film pieces 14 are formed by dividing a semiconductor thin film layer 14w formed on the GaAs substrate 35. The division can be achieved by forming grooves between areas which will become the semiconductor thin film pieces 14.

FIG. 22 shows the construction of the layers before the division into individual semiconductor thin film pieces 14, so that the semiconductor thin film layer is denoted by 14w (with a suffix "w") for distinction from the film pieces (14) after the division. Formed on a GaAs substrate 35 is a buffer layer (GaAs buffer layer) 52 for epitaxially growing a semiconductor thin film piece 14. A sacrifice layer (separation layer) 43 which is for example an AlAs layer is formed thereupon, and the semiconductor thin film layer 14w is formed thereupon. In the semiconductor thin film layer 14, a first contact layer 54 comprises for example an n-type GaAs layer, a first cladding layer 55 comprises for example an n-type AlxGal-xAs layer, a first active layer 56 comprises for example an n-type AlyGal-yAs layer, a second active layer 57 comprises for example a p-type AlyGal-yAs layer, a second cladding layer 58 comprises for example a p-type AlzGal-zAs layer, and a second contact layer 59 comprises for example a p-type GaAs layer.

The semiconductor thin film pieces 14 formed by dividing the semiconductor thin film layer 14w has the same layer configuration.

In the drawings other than FIG. 22, the details of the layer construction of the semiconductor thin film pieces are omitted, 14 and also the buffer layer 52 is omitted, and the sacrifice layer 43 is omitted in most of the drawings.

The process of forming the combination of the semiconductor thin film pieces 14 and the individual and connection supports 37 and 39 is described.

Figure 13:
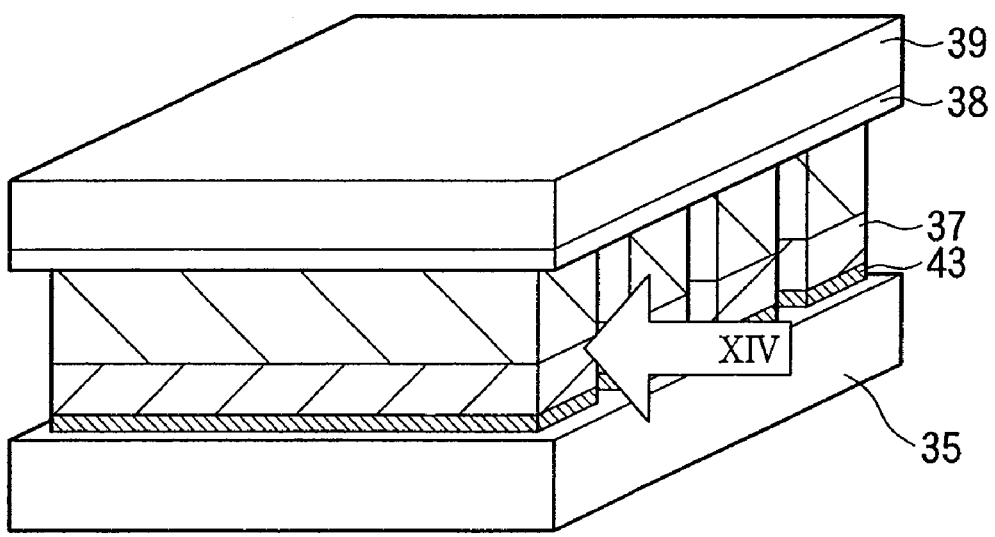
FIG. 13 is a perspective view showing a connection support formed on and stuck to the individual supports.

A sacrifice layer 43 shown in FIG. 13 and semiconductor thin film layers 14 comprising semiconductor epitaxial layers, are first formed on the GaAs substrate 35.

Then, a layer of a material used for forming the individual supports 37 is formed. From this layer, the individual supports 37 having an identical pattern to the pattern of the semiconductor thin film pieces 14 are formed.

In this step, firstly, a material containing for example a photosensitive material is used for forming the individual support layer 37, and a pattern identical to the semiconductor thin film pieces 14 is formed by photolithography. Using the pattern of the thus-formed individual supports 37 as an etching mask, the semiconductor thin film layer 14w is selectively etched. That is, parts of the semiconductor thin film layer 14w which are not covered by the individual supports 37 are etched, to at least such a depth at which the sacrifice layer 43 is exposed. In this etching, for example, phosphoric acid peroxide water (phosphoric acid+hydrogen peroxide water+ pure water) may be used as the etching solution.

Figure 14:
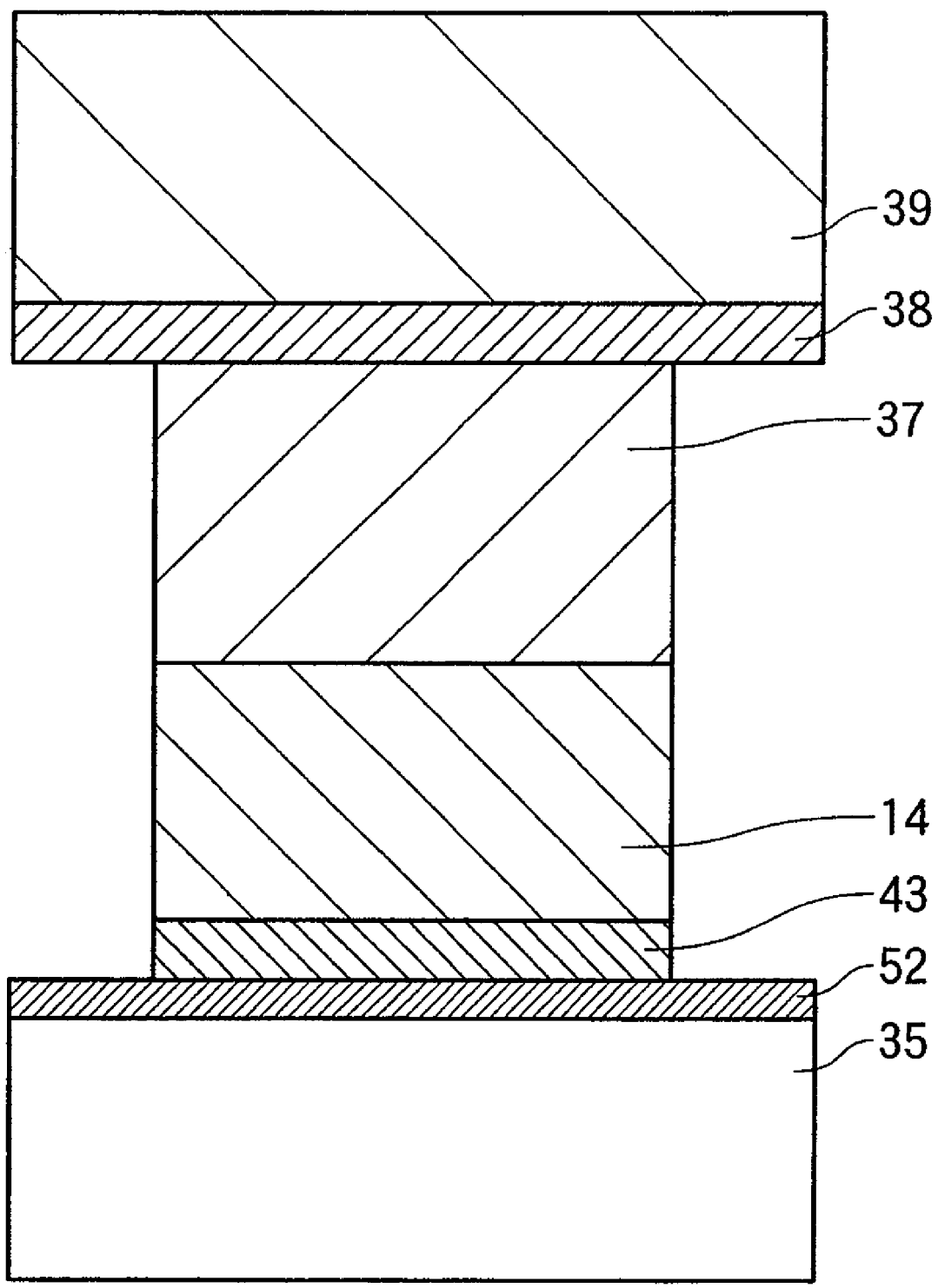
FIG. 14 is a sectional view as seen in the direction of arrow XIV in FIG. 13, and shows only one semiconductor thin film piece and members associated therewith.

Next, as shown in FIG. 13, a connection support 39 is stuck to the individual supports 37. As shown in FIG. 14 which is a sectional view from the direction of the arrow XC in FIG. 13, formed on the GaAs substrate 35 are the GaAs buffer layer 52, the sacrifice layer 43, the semiconductor thin film piece 14, the individual support 37, the tacky-adhesive layer 38, and the connection support 39, which are formed sequentially from below on the GaAs substrate 35. The tacky-adhesive layer 38 is for sticking the individual support 37 and the connection support 39 together, and may have an adhesive force capable of being controlled by light irradiation or heating. "Control of adhesive force" means decreasing from the initial adhesive force by light irradiation or heating.

The connection support 39 may for example be a rigid substrate such as glass, or a flexible substrate such as a plastic substrate having an organic material such as PET (polyethylene terephthalate) as its main component.

Figure 15:
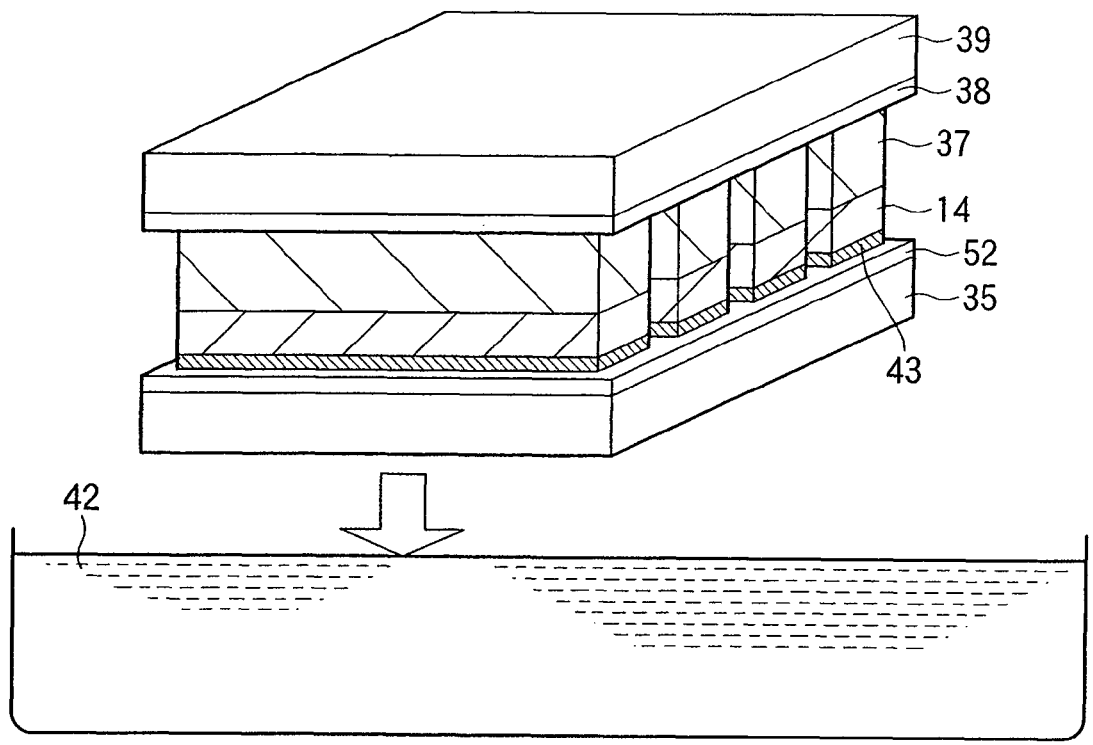
FIG. 15 is a schematic diagram showing a state in which an assembly comprising the growth substrate, semiconductor thin film pieces, individual supports and connection support, is immersed in an etching solution to selectively etch a sacrifice layer.
Figure 16:
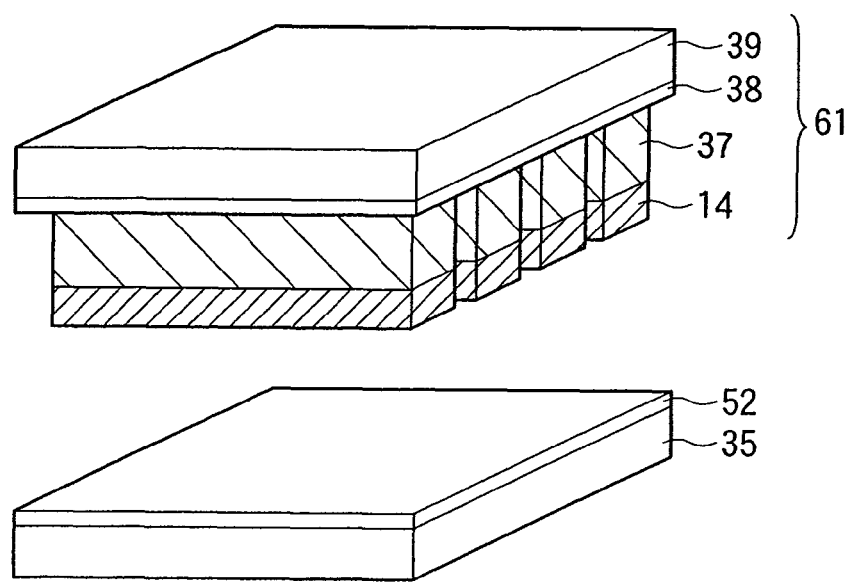
FIG. 16 is a perspective view showing a state in which a thin film substrate comprising the semiconductor thin film pieces, individual supports and connection support is separated from the growth substrate.

Next, the combination of the GaAs substrate 35, the buffer layer 52, the sacrifice layer 43, the semiconductor thin film pieces 14, the individual supports 37, the tacky-adhesive layer 38 and the connection support 39 is immersed in the etching solution, as shown in FIG. 15, and the sacrifice layer 43 is selectively etched. After immersion for a time suitable for etching, it is rinsed with water as required, and as shown in FIG. 16, a combination comprising the semiconductor thin film pieces 14, the individual supports 37, the tacky-adhesive layer 38 and the connection support 39 is separated from the GaAs substrate 35 and the buffer layer 52. The combination of the semiconductor thin film 14, and the individual supports 37, the tacky-adhesive layer 38 and the connection support 39, is also called a thin film substrate 61.

Figure 17:
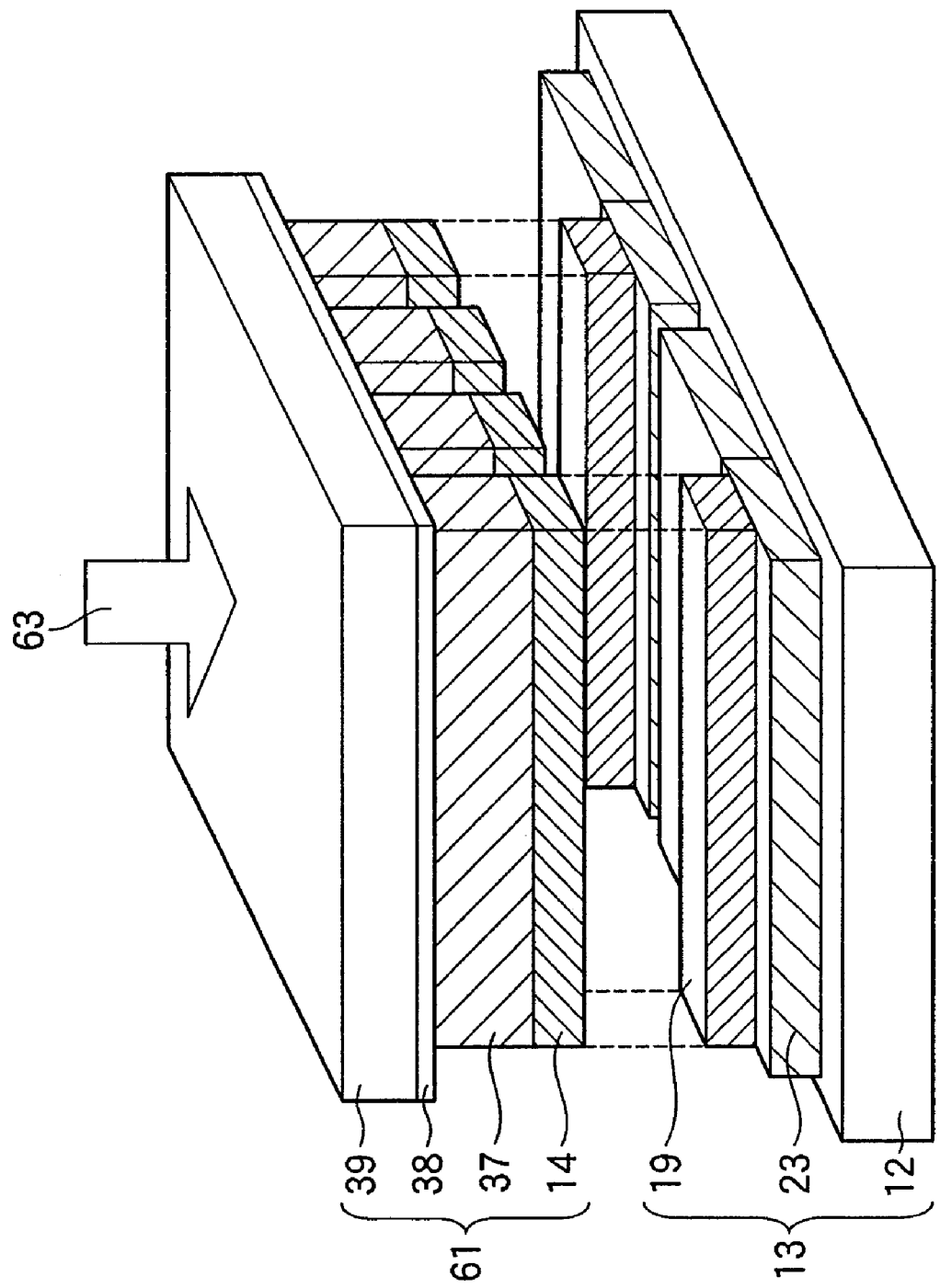
FIG. 17 is a perspective view showing a state in which every third semiconductor thin film pieces in the thin film substrate is aligned with a bonding layer on an IC substrate.

Next, as shown in FIG. 17, an IC substrate 13 comprising a Si substrate 12 on which bonding layers 19, and ICs 15 (which are to be associated with the semiconductor thin film pieces 14) have been formed, and the thin film substrate 61 are given a surface treatment, for example hydrophilic surface treatment, so that their bonding surfaces are suitable for bonding.

The surface treatment may be suitably selected from among for example etching the surface with an etching solution, plasma irradiation in a vacuum, or ion irradiation in a vacuum or under atmospheric pressure. If a gas is used for plasma or ion irradiation, it may be suitably selected from among, for example, hydrogen, nitrogen, oxygen, argon, ammonia or air (a mixed gas having nitrogen and oxygen as its main components).

Figure 18:
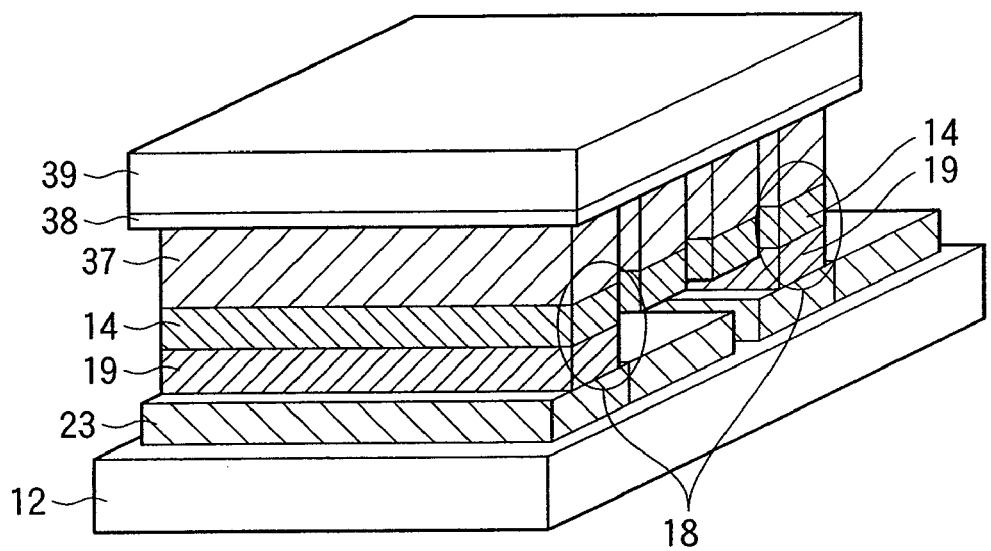
FIG. 18 is a perspective view showing a state in which every third semiconductor thin film piece in the thin film substrate has been brought to contact with a bonding layer on an IC substrate.

Next, the thin film substrate 61 and the IC substrate 13 are arranged to face each other, such that a first set of the semiconductor thin film pieces 14 consisting of every third semiconductor thin film piece are aligned with the bonding areas 18 on the IC substrate 13. The first set of the semiconductor thin film pieces 14 aligned with the bonding areas 18 are brought into contact with the bonding layers 19, as shown in FIG. 18, and bonded, by means of the intermolecular forces between the surfaces of the semiconductor thin film pieces 14 and the surfaces of the bonding layers 19.

In this process, the adhesive force between the individual supports 37 and the connection support 39 is decreased so that the semiconductor thin film pieces 14 and the individual supports 37 for the semiconductor thin film pieces are transferred to the bonding layers 19. For this purpose, for example a light 63 is irradiated. Specifically, the adhesive force of this tacky-adhesive layer 38 provided between the individual supports 37 and the connection support 39 as shown in FIG. 14 is arranged to become less than the intermolecular forces between the surfaces of the semiconductor thin film pieces 14 and the surfaces of the bonding layers 19, by light irradiation (e.g., UV irradiation).

Among a row of semiconductor thin film pieces 14 of the thin film substrate 61, a set of semiconductor thin film pieces 14 consisting of every third semiconductor thin film piece conform to the arrangement pitch of the bonding areas 18, and can be simultaneously aligned with the bonding areas 18, and can be bonded simultaneously to the bonding layers 19.

The selective bonding can be achieved due to the difference in height between the bonding layers 19 and the member in the surrounding areas.

In this way, the first set of the semiconductor thin film pieces 14 selected from among the semiconductor thin film pieces of the thin film substrate 61 are bonded to the bonding layers 19 on the Si substrate 12.

Subsequently, in a manner to similar to that shown in FIG. 10, light, e.g., UV light is selectively irradiated from the side of the connection support 39 to the tacky-adhesive layer 38 aligned with the bonding layers 19, so that the tacky-adhesive strength of the tacky-adhesive layer 38 aligned with bonding layers 19 decreases, and the semiconductor thin film pieces 14 are thus bonded to the bonding layers 19.

The remaining semiconductor thin film pieces 14 which are not aligned with the bonding areas 18 are not bonded to the bonding layers 19.

Figure 19:
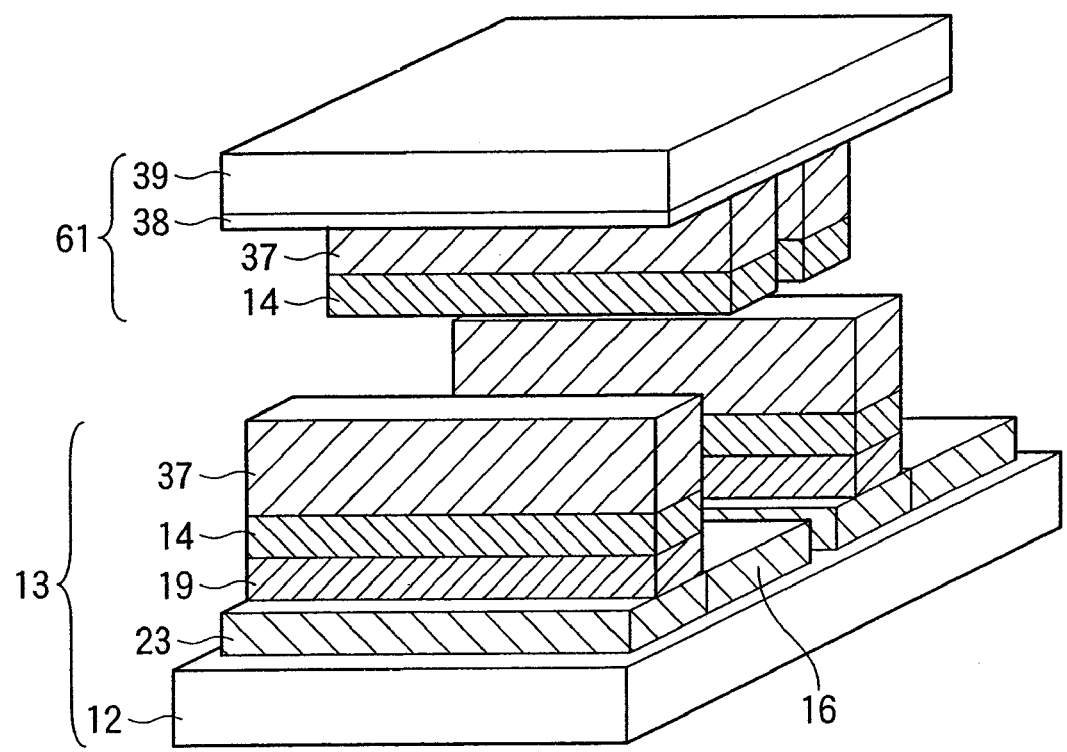
FIG. 19 is a perspective view showing a state in which every third semiconductor thin film piece has been bonded to the bonding layer, while remaining semiconductor thin film pieces are lifted together with the connection support.

When the connection support 39 is lifted, the "remaining" semiconductor thin film pieces 14 and the associated individual supports 37 are lifted together with the connection support 39, as shown in FIG. 19. The remaining semiconductor thin film pieces 14, the associated individual supports 37 and the connection support 39 form a thin film substrate 61 after the process step of FIG. 18.

The semiconductor thin film pieces 14 in the areas which were not aligned with the bonding areas 18 of an IC substrate 13 at the preceding bonding step shown in FIG. 17, were not transferred to the IC substrate 13, and remain on the thin film substrate 61. A second set of the semiconductor thin film pieces 14 selected from among the remaining semiconductor thin film pieces 14 (i.e., still forming part of the thin film substrate 61) are bonded to the bonding layers 19 of another part of the same IC substrate 13, or on another IC substrate 13. The second set of the semiconductor thin film pieces 14 consists of the semiconductor thin film pieces at every third mounting position on the connection support 39. Here the term "mounting position" means the position at which each combination of a semiconductor thin film 14 and an associated individual support 37 is or used to be attached or mounted to the connection support. Using the term "mounting position," the first set of the semiconductor thin film pieces 14 can be said to consist of semiconductor thin film pieces at every third mounting position. The second set of the semiconductor thin film pieces 14 also conform to the arrangement pitch of the bonding areas 18 of the IC substrate 13.

Figure 20:
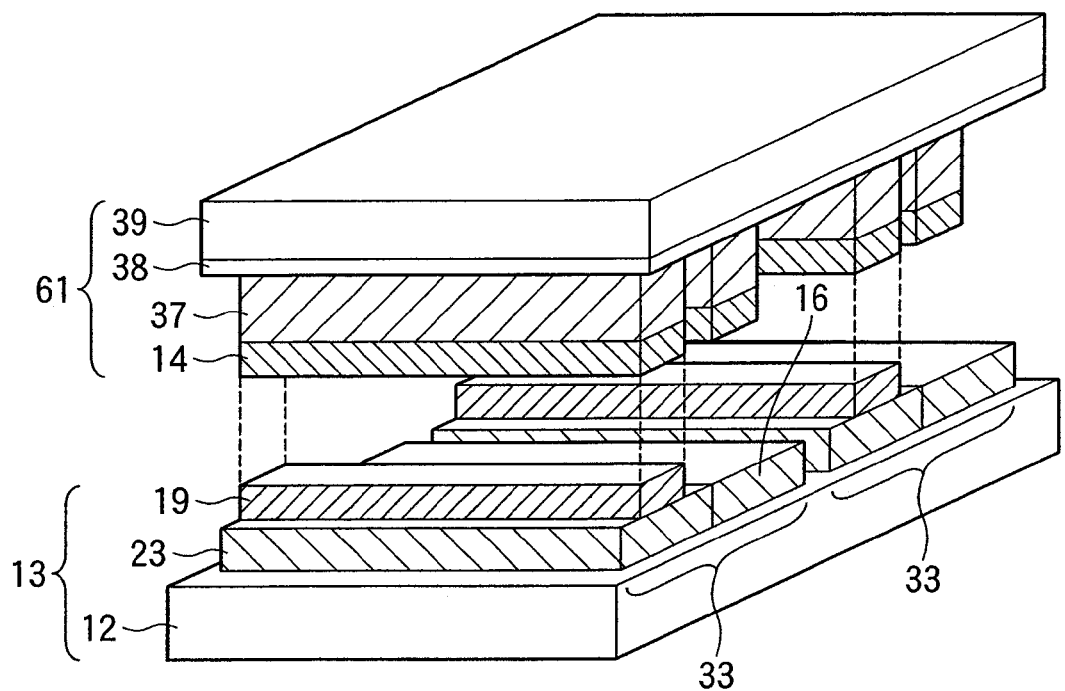
FIG. 20 is a perspective view showing a state in which some of the semiconductor thin film pieces remaining in the thin film substrate are aligned with bonding layers on an IC substrate.

For such bonding or transfer of the second set of the semiconductor thin film pieces to another part of the same IC substrate 13 or another IC substrate 13, the thin film substrate 61 and the IC substrate 13 are made to face each other, in such a manner that the second set of the semiconductor thin film pieces 14 are aligned with the bonding areas 18, as shown in FIG. 20. The second set of the semiconductor thin film pieces 14 are brought into contact with and bonded to the bonding layers 19, in the same manner as described above in connection with FIG. 18.

Only those of the semiconductor thin film pieces which are aligned with bonding areas 18 are bonded to the bonding layers 19, and remaining semiconductor thin film pieces 14 and the associated individual supports 37 are kept attached to the connection support 39, and still remain in the thin film substrate 61.

Figure 21:
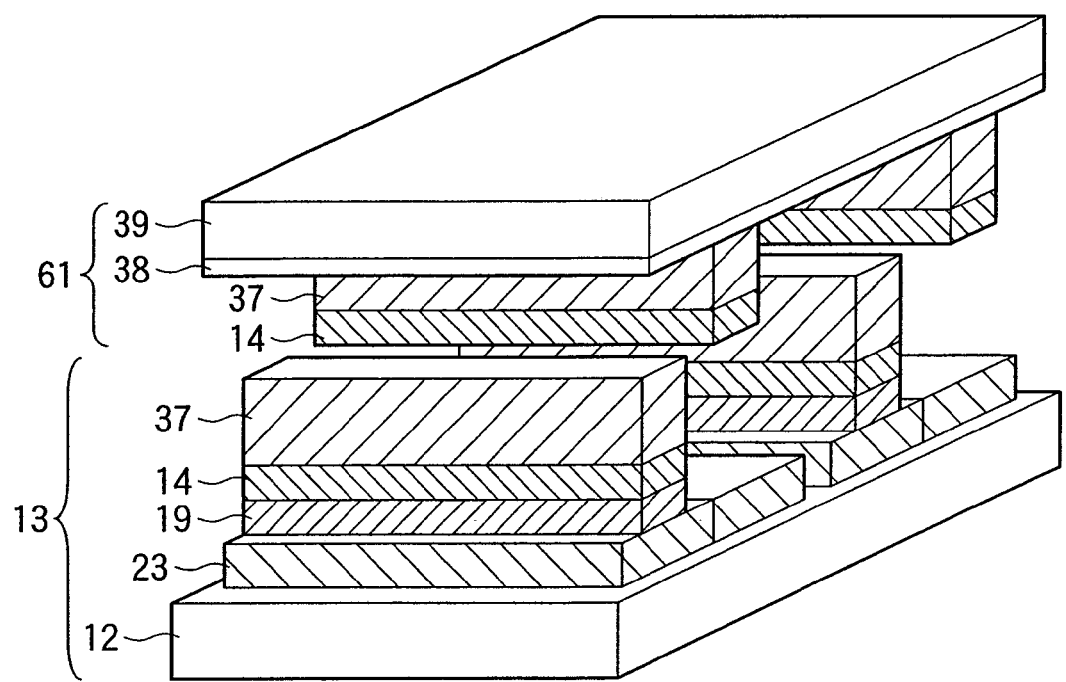
FIG. 21 is a perspective view showing a state where only the semiconductor thin film pieces aligned with the bonding layers have been transferred to the IC substrate.

When the connection support 39 is subsequently lifted, the still-remaining semiconductor thin film pieces 14 and the associated individual supports 37 are also lifted, together with the connection support 39, as shown in FIG. 21. The still-remaining semiconductor thin film pieces 14, and the associated individual supports 37, and the connection support 39 form the thin film substrate 61 after the above-described step of transfer.

By repeating the operations (steps) of positioning a set of selected semiconductor thin film pieces 14 in alignment with the bonding areas 18 of yet another part of the same IC substrate or on yet another IC substrate 13, in a manner similar to that shown in FIG. 20, and transferring only the semiconductor thin film pieces 14 aligned with the bonding areas 18 in a manner similar to that shown in FIG. 21, until there remains no semiconductor thin film pieces 14 in the thin film substrate 61 or there no longer remain a sufficient number of semiconductor thin film pieces 14.

Figure 23:
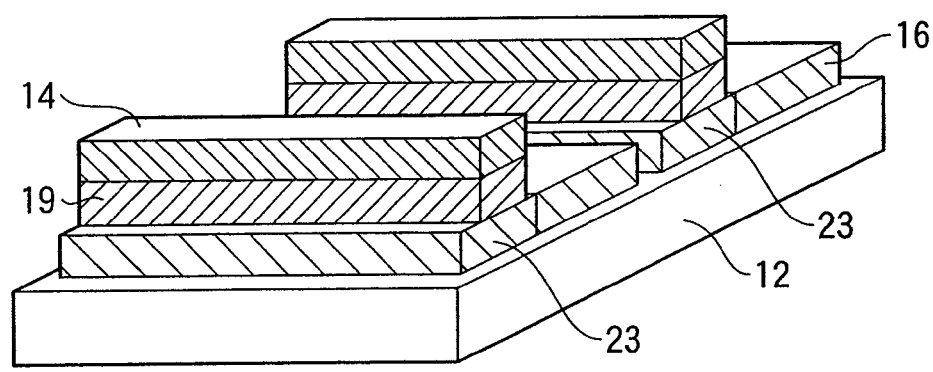
FIG. 23 is a perspective view showing a state in which the individual supports have been removed leaving the semiconductor thin film pieces on the bonding layers.

After the semiconductor thin film pieces 14 together with the individual supports 37 are bonded to the IC substrate 13, as shown in FIG. 23, the individual supports 37 shown in FIG. 23 can be removed using for example an organic solvent or a release solvent.

Figure 24:
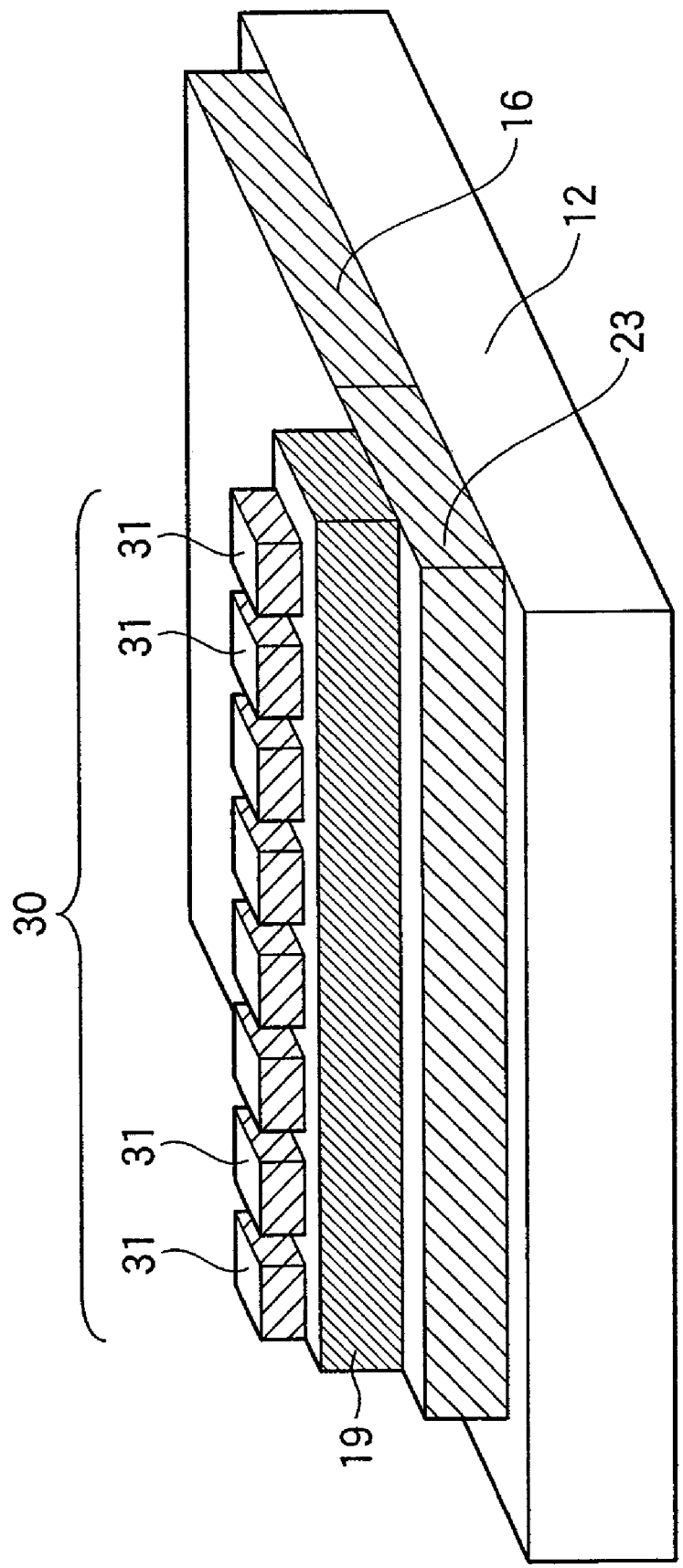
FIG. 24 is a perspective view showing a state where a row of separate light-emitting elements are formed by element isolation from each semiconductor thin film piece.

After the individual supports 37 are removed, each of the semiconductor thin film pieces 14 on the IC substrate 13 is divided into a row of light-emitting elements 31, by element isolation (device isolation), as shown in FIG. 24. The element isolation can be achieved by, for example, ordinary photolithography.

Figure 25:
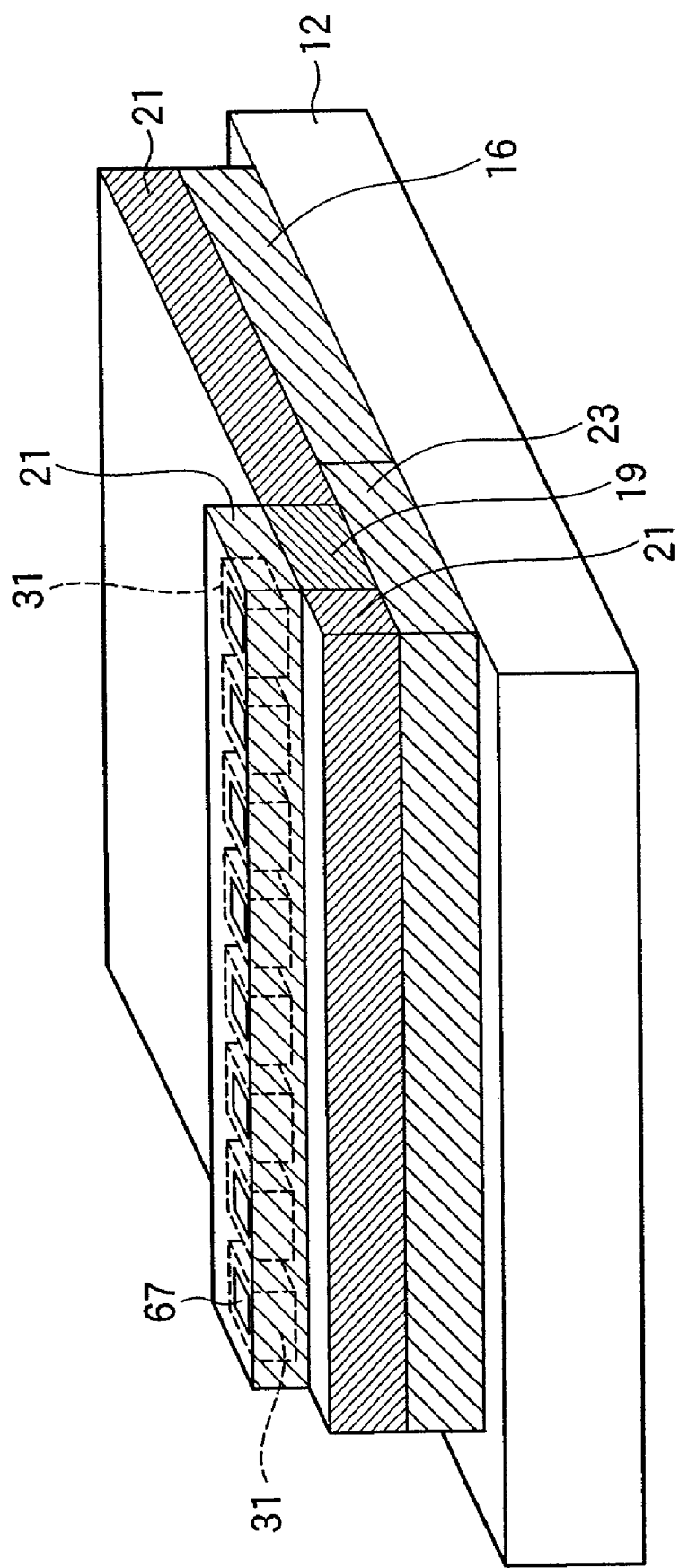
FIG. 25 is a perspective view showing a state in which an interlayer insulation film has been formed.

Next, as shown in FIG. 25, an interlayer insulation film 21 is formed in areas where the light-emitting elements 31 have been formed and the areas where individual interconnections are to be formed.

Then, openings 67 are formed through the interlayer insulation film 21, at areas for contact with the light-emitting elements 31.

Figure 26:
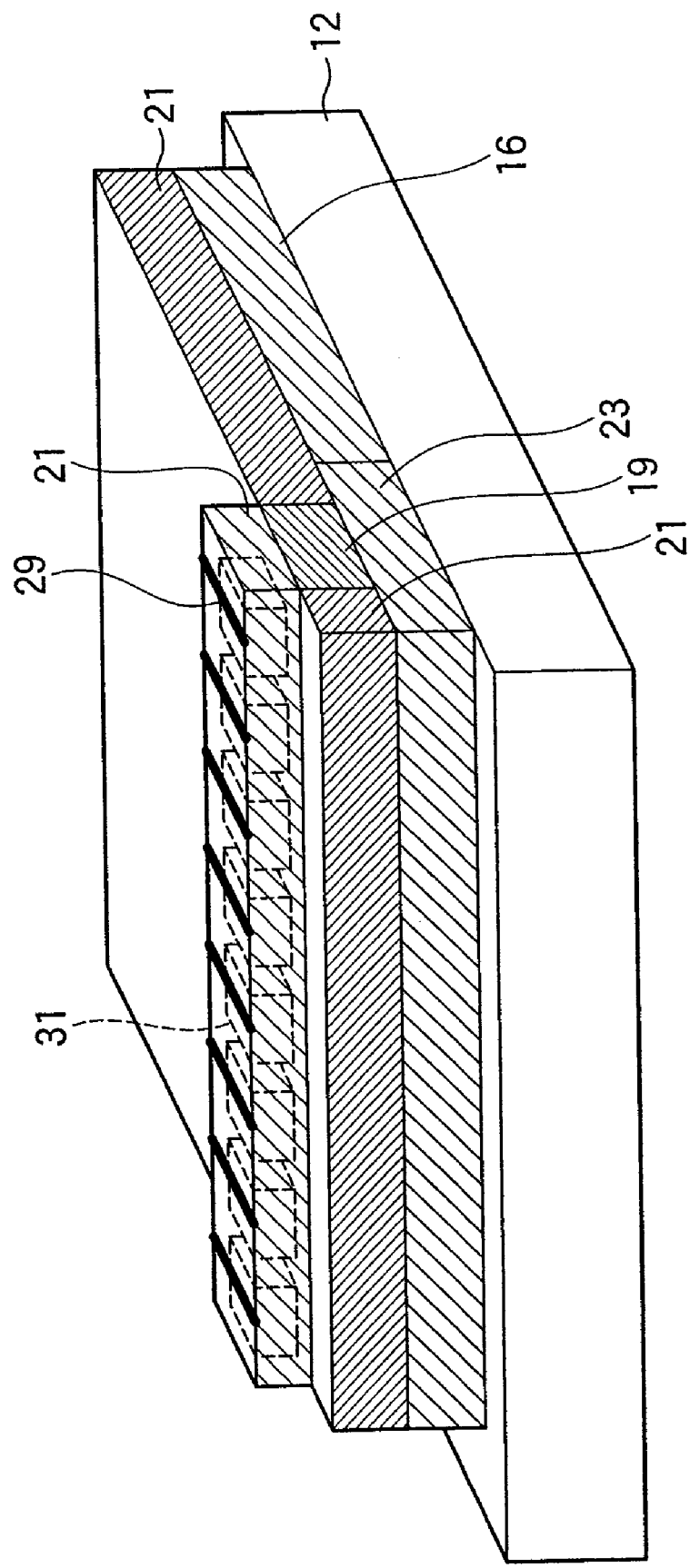
FIG. 26 is a perspective view showing a state in which individual interconnections have been formed.

Next, as shown in FIG. 26, individual interconnections 29 are formed to extend through the openings 67 to be in contact with the light-emitting elements 31, and to connect the light-emitting elements with drive output terminal of the IC which may be a drive circuit.

In this embodiment, the bonding layers 19 are electrically connected beforehand with the terminal of the common potential of the drive circuit.

In the above-described embodiment, a method of manufacturing a semiconductor device was described wherein a semiconductor thin film pieces comprising light-emitting elements formed on a GaAs substrate (growth substrate) are bonded to driver IC chip areas 33 in an IC substrate 13 comprising a Si substrate 12, and the semiconductor thin film pieces 14 at positions conforming to the arrangement pitch of the driver IC chip areas 33 on the IC substrate 13 are selectively bonded. However, the invention is not limited to situations where the growth substrate is a GaAs substrate, and the IC substrate 13 comprises a Si substrate.

The material of the semiconductor thin film pieces formed on the growth substrate may be a different compound semiconductor, such as InP, AlGaInP, InGaAsP, GaN, InGaN or AlGaN, or it may be an inorganic semiconductor such as monocrystalline Si or polycrystalline Si.

Further, corresponding to the material of the semiconductor thin film pieces, the material of the growth substrate may be other than GaAs, and may for example be InP, GaP, sapphire or Si. The material of the second substrate may also be other than Si, and may for example be glass, ceramics, metal, plastic or quartz.

In the above-described embodiment, the semiconductor element may be other than a light-emitting element, for example a light-receiving element, drive element, memory element, computing element or piezoelectric element.

The individual supports may be omitted, and the connection support may be provided directly on the semiconductor thin film piece. In this case, the semiconductor thin film pieces to be transferred to the second substrate can be bonded to the connection support directly, and are later separated from it, and bonded to the second substrate. At the time of separation and bonding, the bonding strength can be weakened by irradiation with light. Accordingly, the separation and bonding can be conducted in a stable state, and the cleaning and other processing of the connection support before subsequent use for bonding another set of semiconductor thin film pieces is facilitated.

As described above, in the method of manufacturing a semiconductor device according to Embodiment 2 of the invention, the arrangement pitch P1 of the semiconductor thin film pieces formed on the growth substrate 35, and hence the arrangement pitch P1 of the semiconductor thin film pieces 14 supported by the individual and connection supports 37 and 39, is made an integral fraction of the arrangement pitch P2 of the bonding areas for respective IC chip areas 33 on the IC substrate 13, and, only those of the semiconductor thin film pieces 14 on the growth substrate 35 that correspond to the bonding areas 18, and hence only those of the semiconductor thin film pieces 14 which are supported by the individual and connection supports 37 and 39 are aligned with the bonding area 18, are bonded to the bonding layers 19 on the IC substrate 13, and the semiconductor thin film pieces in other areas are bonded to bonding layers on different parts of the same IC substrate or on different IC substrate. Therefore, a plurality of semiconductor thin film pieces formed in a row on the growth substrate can be bonded on an IC substrate, while effectively converting the arrangement pitch in one bonding step.

Embodiment 3

Figure 27:
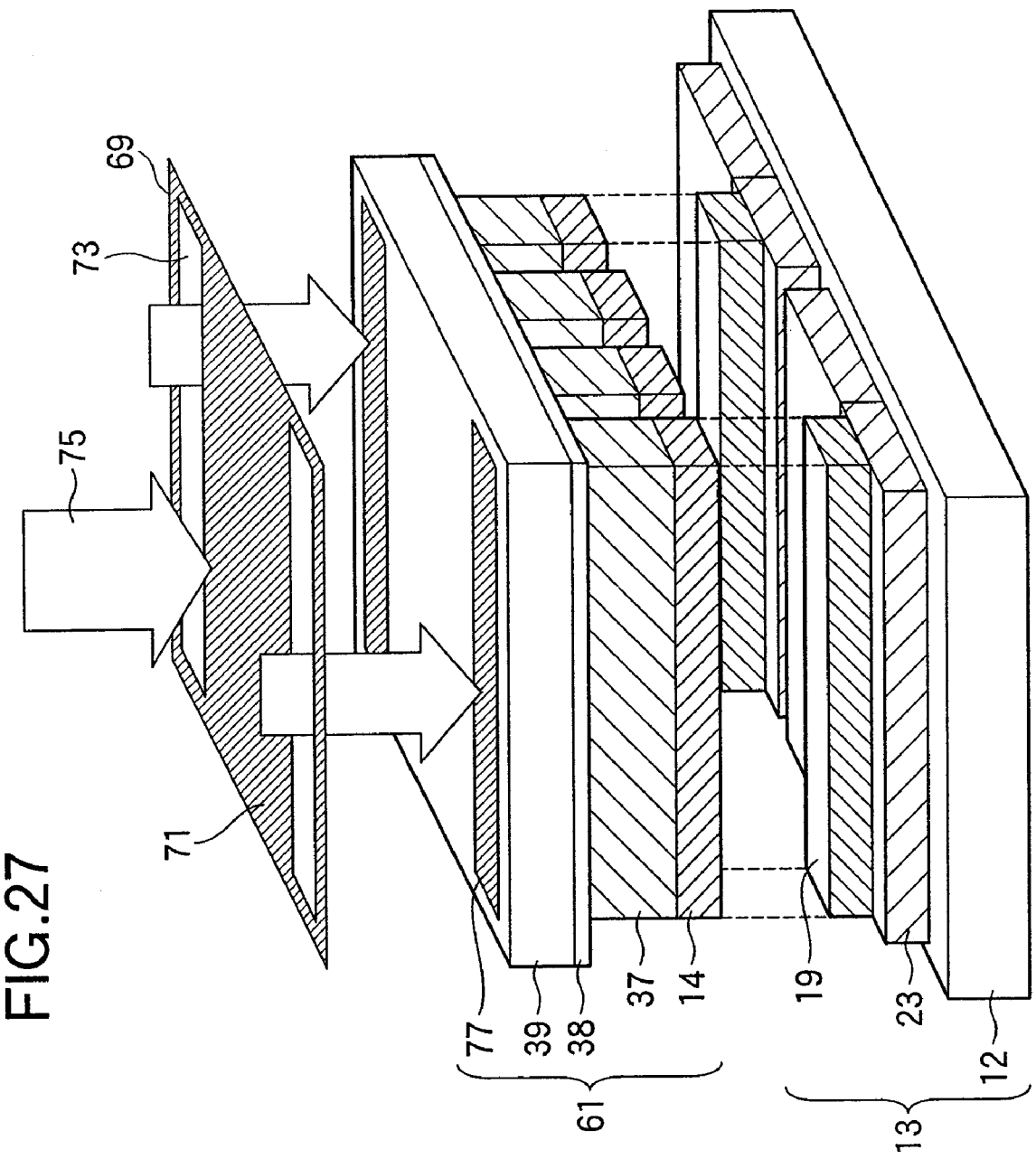
FIG. 27 is a perspective view showing a state in which UV light is selectively irradiated to the tacky-adhesive layer according Embodiment 3 of this invention.

FIG. 27 is a perspective view showing a step of a method of manufacturing a semiconductor device according to Embodiment 3 of this invention.

The step shown in FIG. 27 correspond to the step shown in FIG. 10. In the step shown in FIG. 27, a mask 69 is used for selective irradiation of light to the thin film substrate 61, in particular the tacky-adhesive layers 38 between the individual and connection supports 37 and 39, to selectively reduce the adhesion force between the individual and connection supports 37 and 39.

The mask 69 may be made of quartz glass with chromium plating, with the plated part 71 shielding light, while unplated parts 73 permitting passage of light. The light 75 passing the unplated parts 73 irradiates areas 77 of the thin film substrate 61 corresponding to the bonding areas 18. The adhesion strength of the tacky-adhesive layer 38 at the irradiated areas 77 is weakened, so that when the semiconductor thin film pieces 14 are bonded to the bonding layers 19, the semiconductor thin film pieces 14 and the individual supports 37 can be easily separated from the connection support 39.

As an alternative to the method using the mask 69, irradiation may selectively be performed by means of laser scanning with an ultraviolet laser.

In this way, according to Embodiment 3, by selectively reducing the adhesion force between the individual supports 37 for the semiconductor thin film pieces 14 corresponding to the bonding areas 18, and the connection support 39, the semiconductor thin film pieces 14 can be transferred only to the bonding layers 19 in the selected bonding areas 18, so the semiconductor thin film pieces 14 to be transferred to other IC substrates 13 or other IC chip areas 33 are kept stuck to the connection support 39. As a result, cleaning of the bonding surfaces of the semiconductor thin film pieces 14 can be easily performed. The remaining semiconductor thin film pieces 14 can be transferred to the other IC substrates 13 or other IC chip areas 33.

In place of the selective irradiation, the light may be irradiated unselectively, i.e., over the whole surface of the thin film substrate 61, if it is possible to reduce the adhesion force to such a degree that only the selected semiconductor thin film pieces 14 are bonded to the bonding layers 19, while the other semiconductor thin film pieces 14 with the associated individual supports 37 remain fixed to the connection support 39.

Embodiment 4

FIGS. 28 to 33 show a method of manufacturing a semiconductor device according to Embodiment 4 of this invention.

Figure 28:
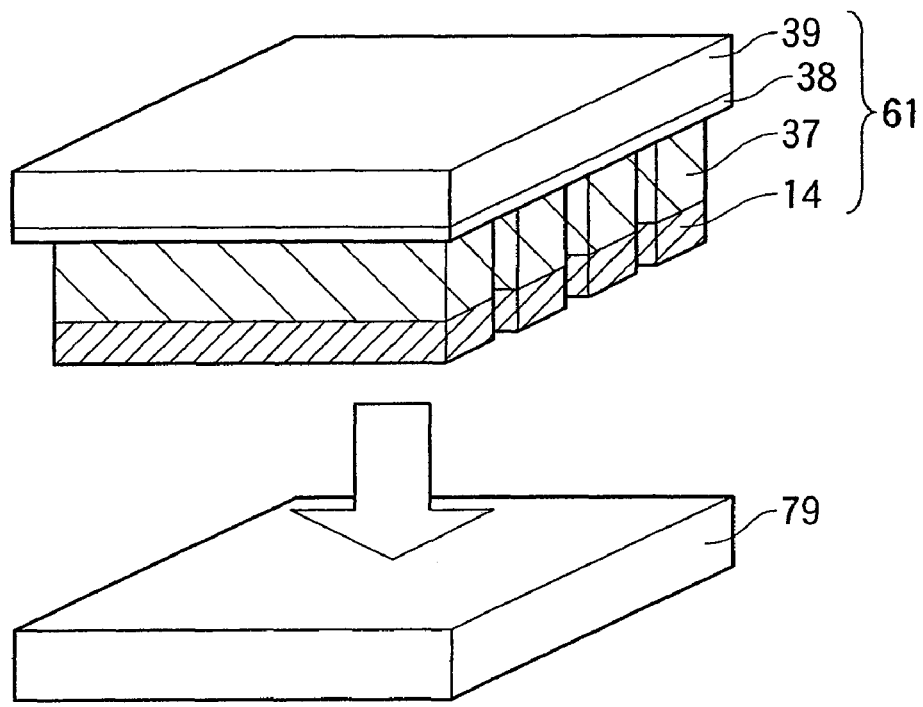
FIG. 28 is a schematic perspective view showing a state in which a thin film substrate are being installed on a temporary installation substrate.

FIG. 28 shows a thin film substrate 61 similar to that shown in FIG. 7C, as well as a temporary installation substrate 79. The thin film substrate 61 is formed on a growth substrate, not shown, in a manner similar to that described in connection with Embodiment 2.

The temporary installation substrate 79 may be in the form of a vacuum chuck capable of attaching the semiconductor thin film pieces 14 and the individual supports 37 by vacuum suction, and is used for temporary support or installation of the semiconductor thin film pieces 14 and the individual supports 37. The combination of each semiconductor thin film piece 14 and the associated individual support 37 is called a transport piece 81.

Figure 29:
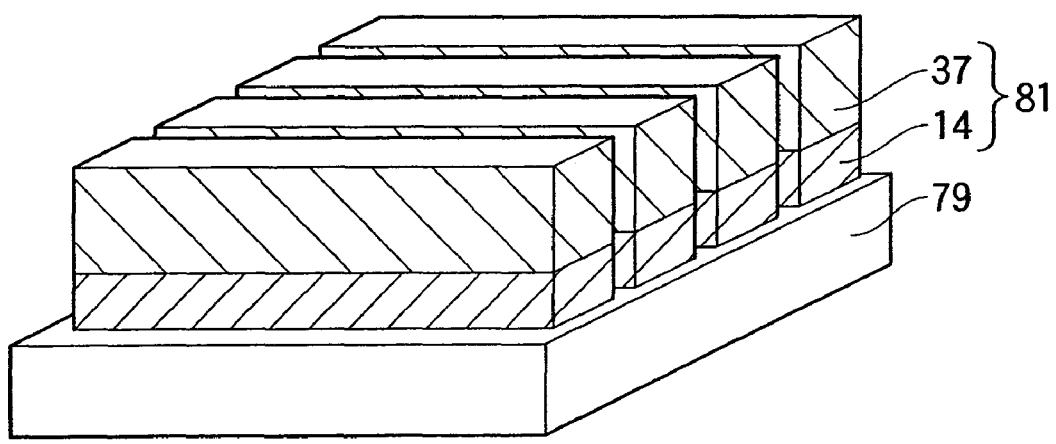
FIG. 29 is a diagram showing a state where the connection support has been removed after the thin film substrate has been installed on the temporary installation substrate.

After the thin film substrate 61 including the semiconductor thin film pieces 14 provided with the individual supports 37 and the connection support 39 is separated from the growth substrate, not shown, it is placed on the temporary installation substrate 79, as shown in FIG. 28. Next, as shown in FIG. 29, the connection support 39 is removed, leaving the transport pieces 81. For this step, for example, the adhesion force of the tacky-adhesive layer 38 is decreased by application of light or heat. The tacky-adhesive layer 38 may be of the photocuring type, thermo cellular type, or thermofusion type. Utilizing the reduction in the adhesion force upon application of light or heat, the connection support 39 can be easily separated from the individual supports 37.

Figure 30:
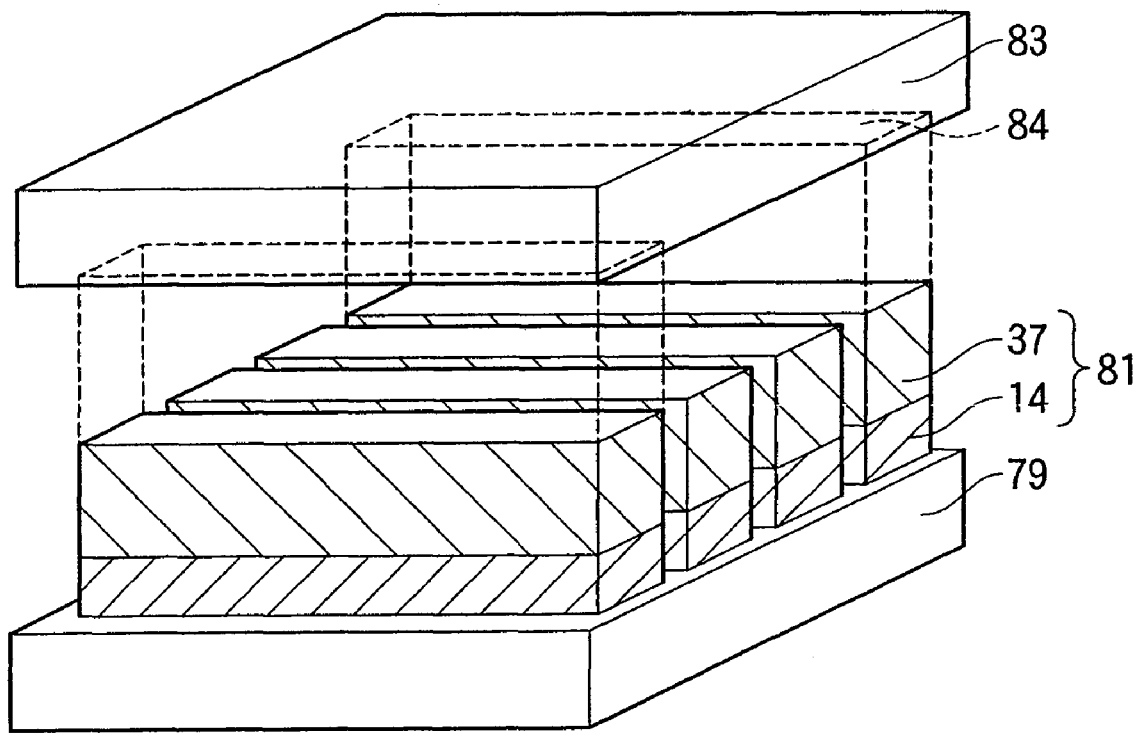
FIG. 30 is a perspective view showing a state in which regions in which a tacky-adhesive layer are provided on a pick-up head are aligned with individual supports.
Figure 31:
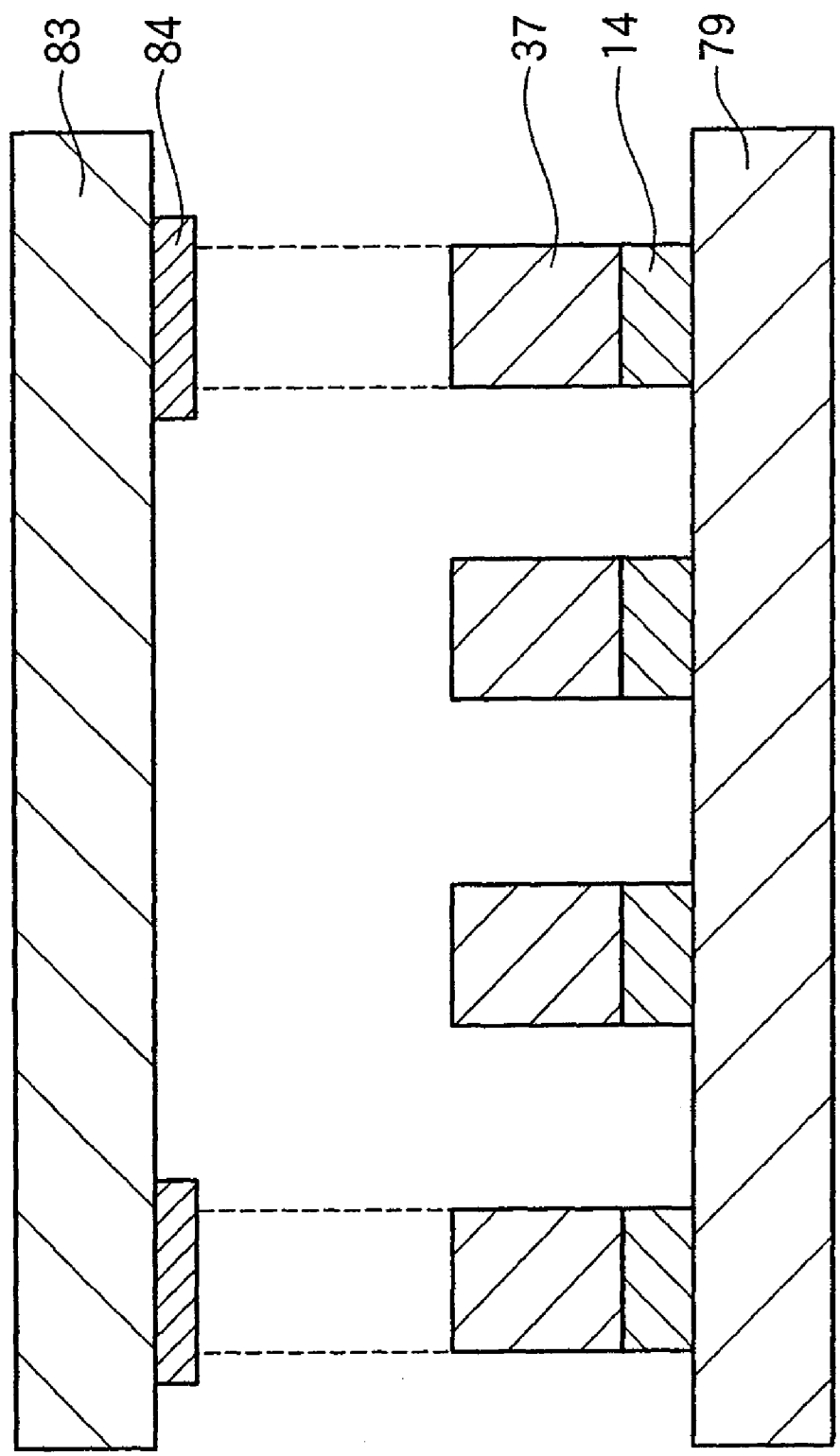
FIG. 31 is a sectional view showing a state in which regions in which a tacky-adhesive layer are provided on a pick-up head are aligned with individual supports.

Next, as shown in FIGS. 30 and 31, a pick-up head 83 having a tacky-adhesive layer 84 is aligned with the transport pieces 81 on the temporary installation substrate 79. The tacky-adhesive layer 84 is provided at regions (adhesion regions) provided at a regular interval corresponding to the pitch of the transport pieces 81 to be selected. In the example shown in FIGS. 30 and 31, every third transport piece 81 is selected. The pitch of (the interval between) the transport pieces 81 to be selected is identical to the arrangement pitch of the bonding areas on the IC substrate 13.

Each of the regions at which the tacky-adhesive layer 84 is provided has a shape corresponding to the shape of the top surface of the individual support 37. Each region of the tacky-adhesive layer 84 may be exactly identical to the shape of the top surface of the individual support 37, or may be extended to cover a margin around the area identical to the shape of the top surface of the individual support 37, in order to allow for misalignment.

The pick-up head 83 is aligned with the temporary installation support 79 in such a manner that the regions of the tacky-adhesive layer 84 are aligned with the transport pieces 81 to be selected, and bonded with the top surfaces of the individual supports 37 of the selected transport pieces 81.

The tacky-adhesive layer 84 can be formed at the adhesion areas of the pick-up head 83, by for example using a nanoimprint technique, screen printing technique or dispensing technique.

Figure 32:
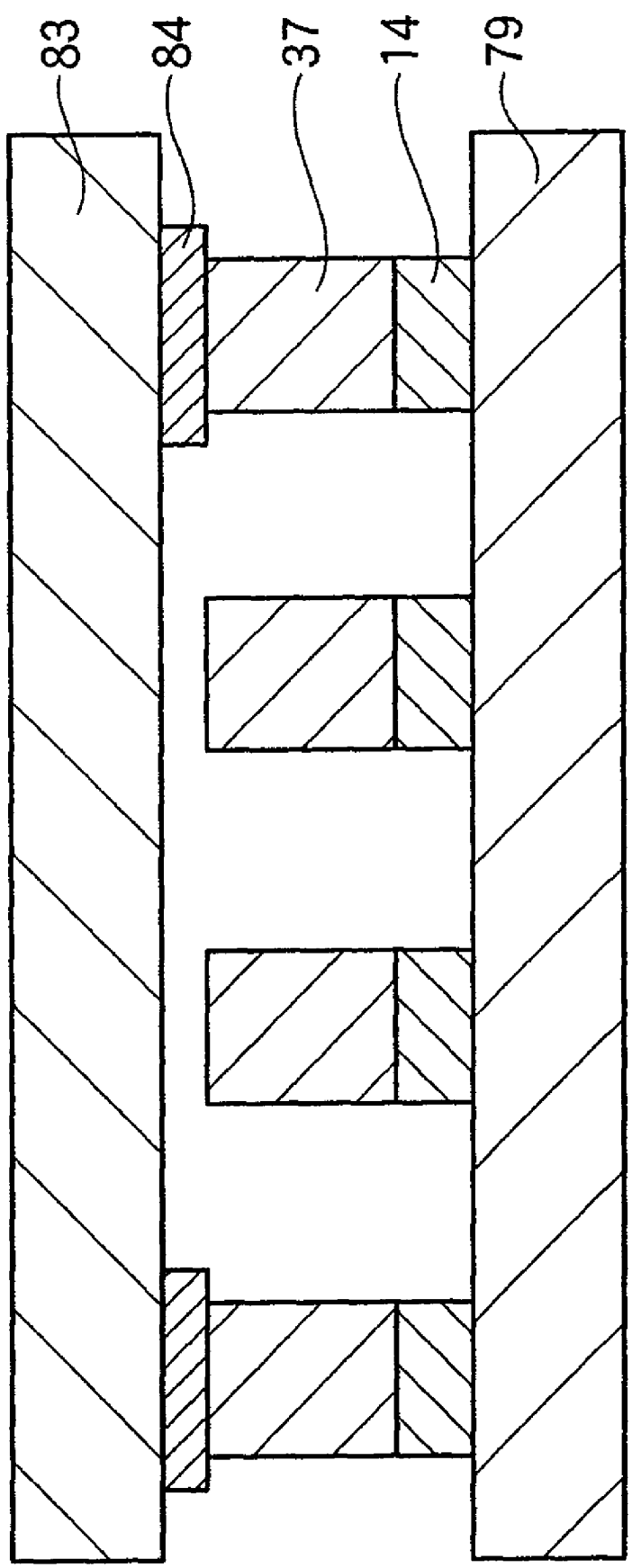
FIG. 32 is a sectional view showing a state in which the tacky-adhesive layer on the pick-up head is bonded with individual supports.
Figure 39:
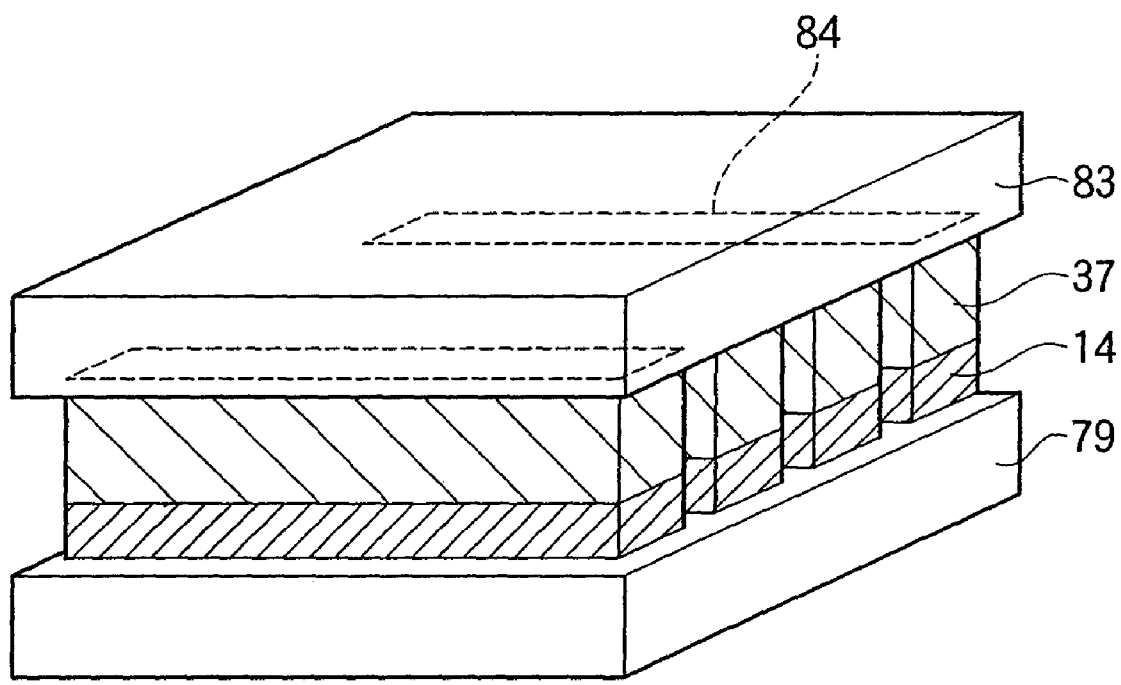
FIG. 39 is a perspective view corresponding FIG. 32.
Figure 40:
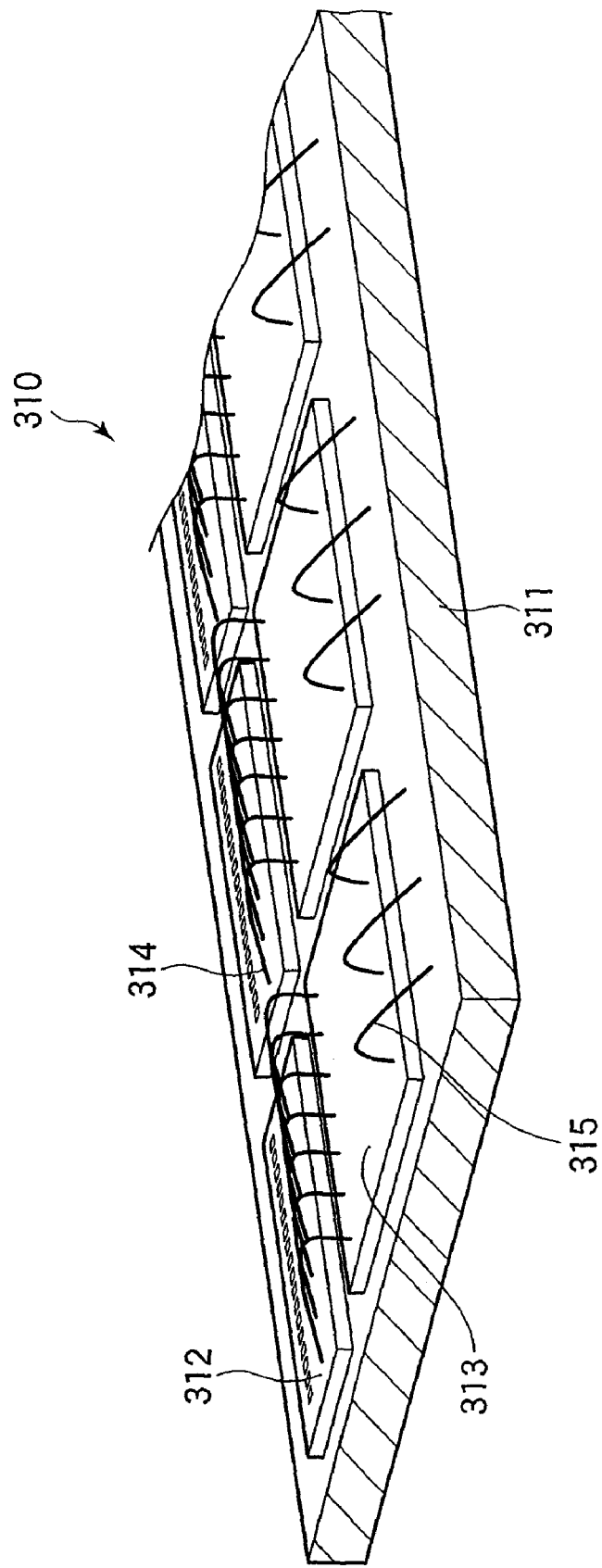
FIG. 40 is a perspective view showing an LED array chip of an LED print head of the prior art.
Figure 41:
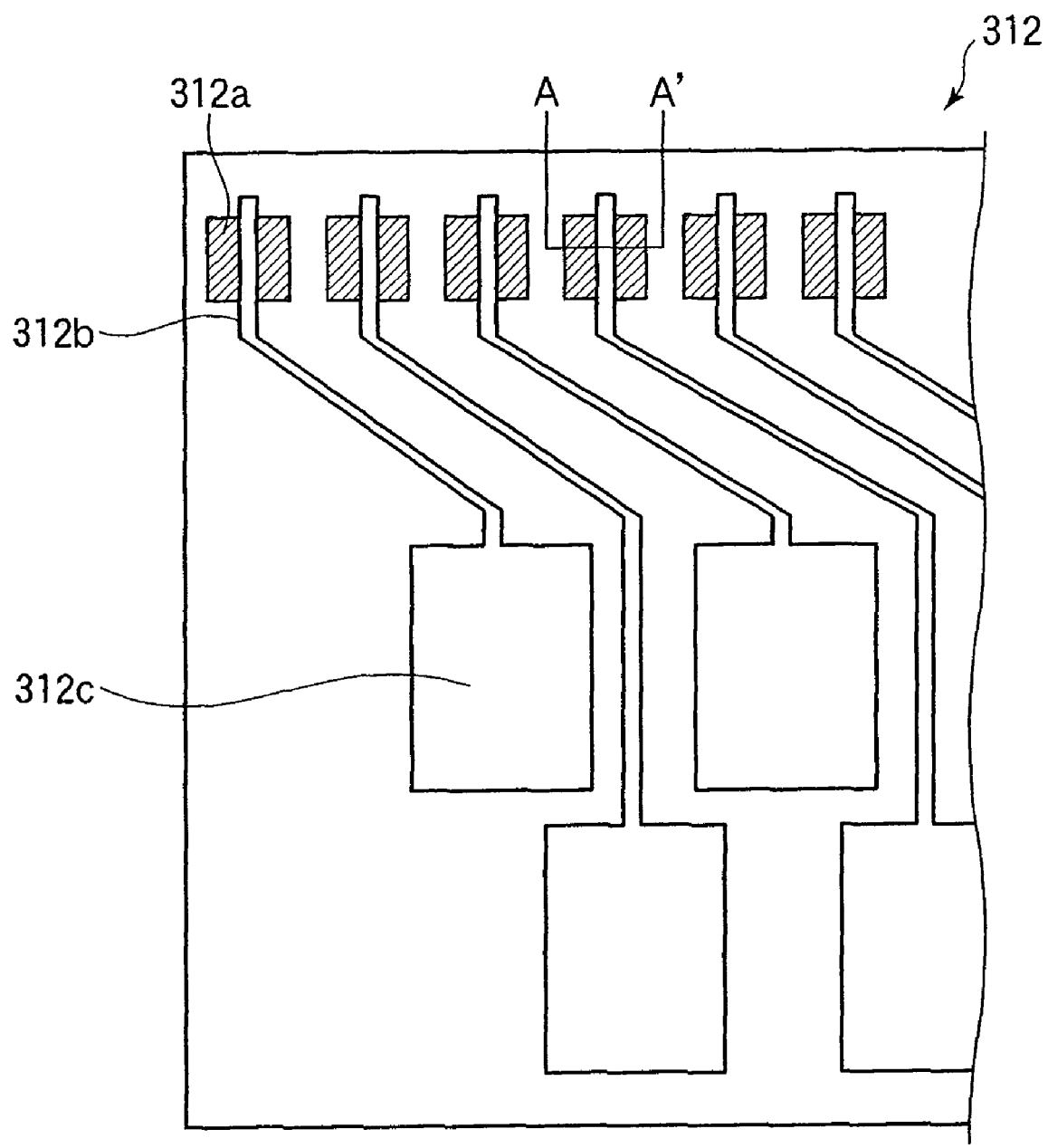
FIG. 41 is a plan view showing individual electrode pads corresponding to light-emitting parts.

Next, as shown in FIG. 32 and FIG. 39, the pick-up head 83 is lowered (brought closer to the temporary installation substrate 79) and are stuck to the individual supports 37 of the transport pieces 81 to be selected.

Figure 33:
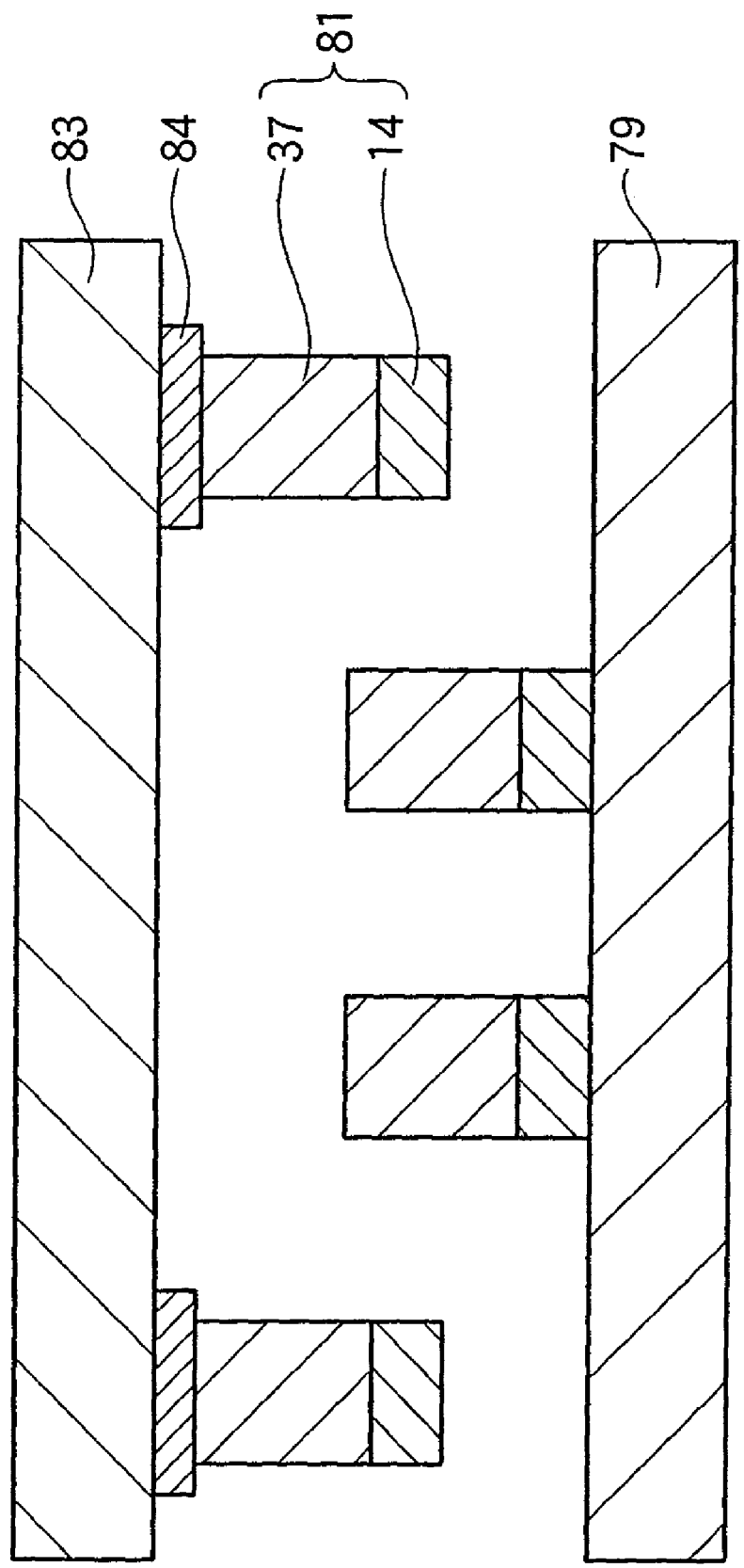
FIG. 33 is a sectional view showing a state where the semiconductor thin film pieces have been selectively removed from the temporary installation substrate.

Next, as shown in FIG. 33, the pick-up head 83 is moved upward so that the pick-up head 83 and the selected transport pieces 81 are lifted, and removed from the temporary installation substrate 79.

The tacky-adhesive layer 84 of the pick-up head 83 is arranged to have an adhesion force sufficiently larger than the attachment force with which the transport pieces 81 (in particular, the bottom surfaces of the semiconductor thin film pieces 14) are attached to the temporary installation substrate 79.

The pick-up head 83 with the plurality of the selected transport pieces 81 having been attached to it is then aligned with an IC substrate 13 similar to that shown in FIG. 9, so that the transport pieces 81 are aligned with the bonding areas 18 on the IC substrate 13. The arrangement pitch of the selected transport pieces 81 on the pick-up head 83 is identical to the arrangement pitch of the bonding areas 18 on the IC substrate 13, so that all the selected transport pieces 81 are respectively aligned with the bonding area 18. The pick-up head 83 is lowered (brought) toward the IC substrate 13 and the transport pieces 81 (in particular the bottom surfaces of the semiconductor thin film pieces 14) are in contact with and bonded to the bonding layers 19.

UV light may be irradiated from the side of the pick-up head 83 to the tacky-adhesive layer 84, to thereby weaken the adhesive force.

When the pick-up head 83 is thereafter lifted, the transport pieces 81 are left stuck on the bonding layers 19.

The above-described process of selectively picking up, by means of a pick-up head 83 the transport pieces 81 from the temporary installation substrate 79, and bonding the transport pieces 81 to the bonding layers 19 of an IC substrate 13 can be repeated until there remain no or not-enough transport pieces 81.

In the example described above, the tacky-adhesive layer 84 is provided at regions provided at an interval corresponding to the pitch of the transport pieces 81 to be selected.

Figure 34:
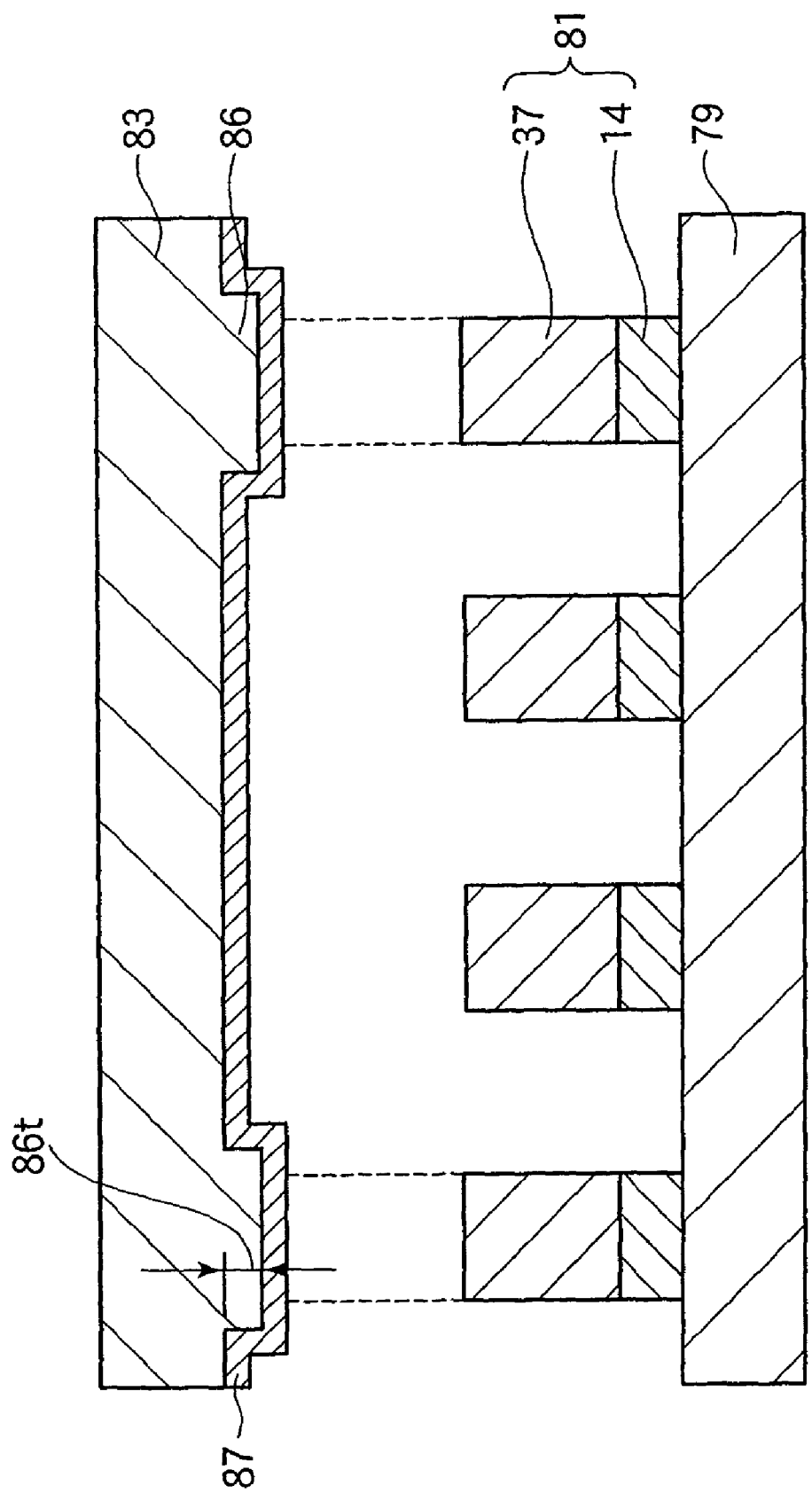
FIG. 34 is a sectional view showing a state in which projections on a pick-up head are aligned with individual supports.

Alternatively, projections 86 may be formed at regions (adhesion regions) at an interval corresponding to the pitch of the transport pieces 14 to be selected, and a tacky-adhesive layer 87 may be provided over the whole of the lower surface of the pick-up head 83, as shown in FIG. 34. The step height 86t of the projections 86 may for example be 100 µm.

Figure 35:
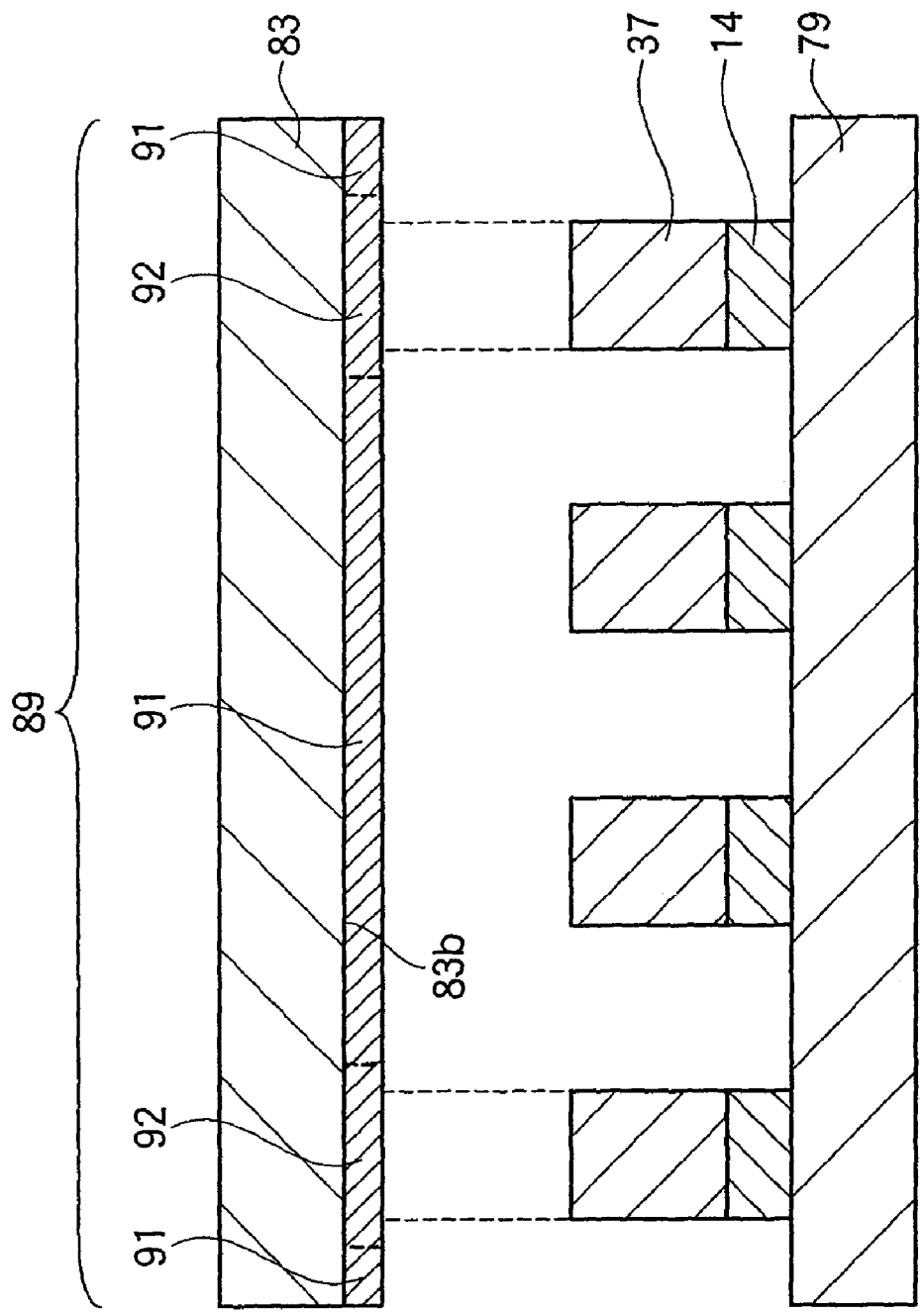
FIG. 35 is a sectional view showing a state in which selected parts of the tacky-adhesive layer are aligned with individual supports.
Figure 36:
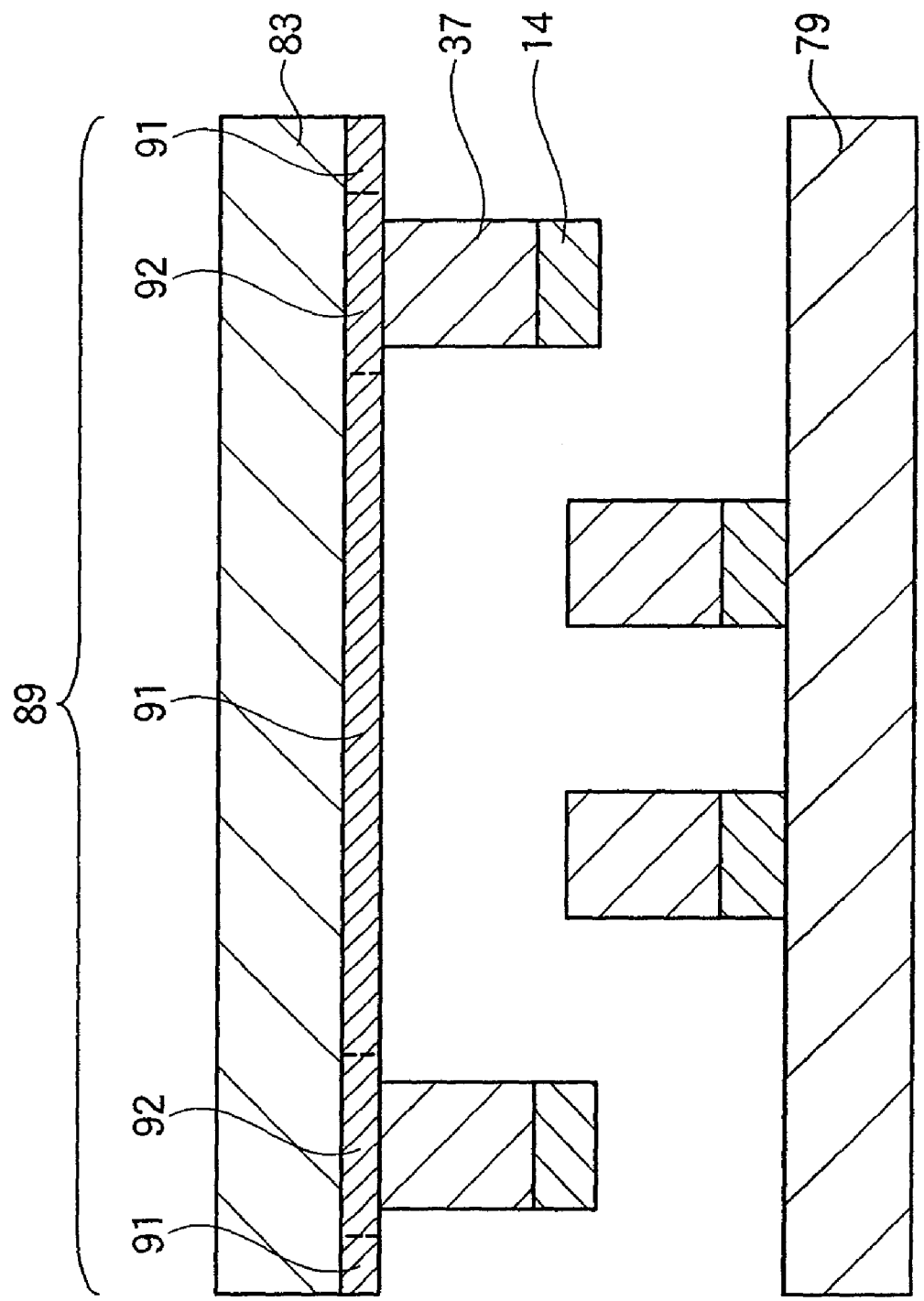
FIG. 36 is a sectional view showing a state in which some of the individual supports with semiconductor thin film pieces are lifted by the pick-up head.

Still alternatively, the pick-up head 83 may have a flat lower surface 83b, and a tacky-adhesive layer 89 may be formed over the whole of the lower surface 83b of the pick-up head 83, as shown in FIG. 35. In this case, the tacky-adhesive layer 89 is preferably of the type which induces a change of tackiness due to heat or light. The tacky-adhesive layer 89 at the regions (non-adhesion regions) 91 other than the adhesion regions 92 may be selectively irradiated with light so that the adhesion force in the non-adhesion regions 91 is reduced or lost.

Figure 37:
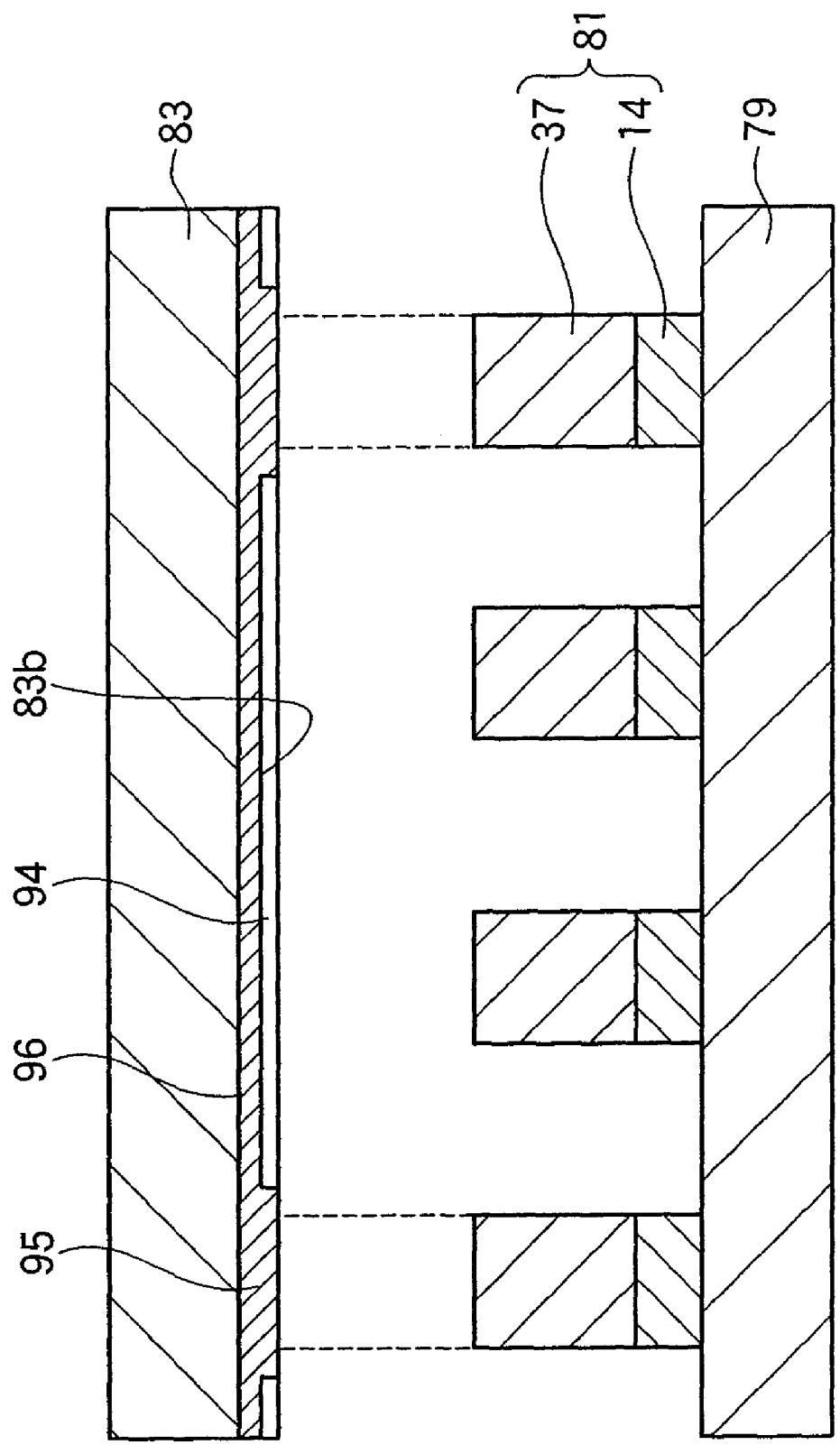
FIG. 37 is a sectional view showing a state in which exposed parts of a tacky-adhesive layer are aligned with individual supports.

Still alternatively, as shown in FIG. 37, a sheet 94 having openings 95 may be provided to cover a tacky-adhesive layer 96 on the lower surface 83b of the pick-up head 83. The openings 95 are provided at adhesion regions at an interval corresponding to the pitch of the transport pieces to be selectively picked up. When the pick-up head 83 is lowered (brought) toward the temporary installation substrate 79, direct contact and hence sticking between the tacky-adhesive layer 96 and the top surfaces of the individual supports 37 occurs only at the openings 95, i.e., only with the top surfaces of the individual supports 37 of the transport pieces 81 that are to be selected.

Figure 38:
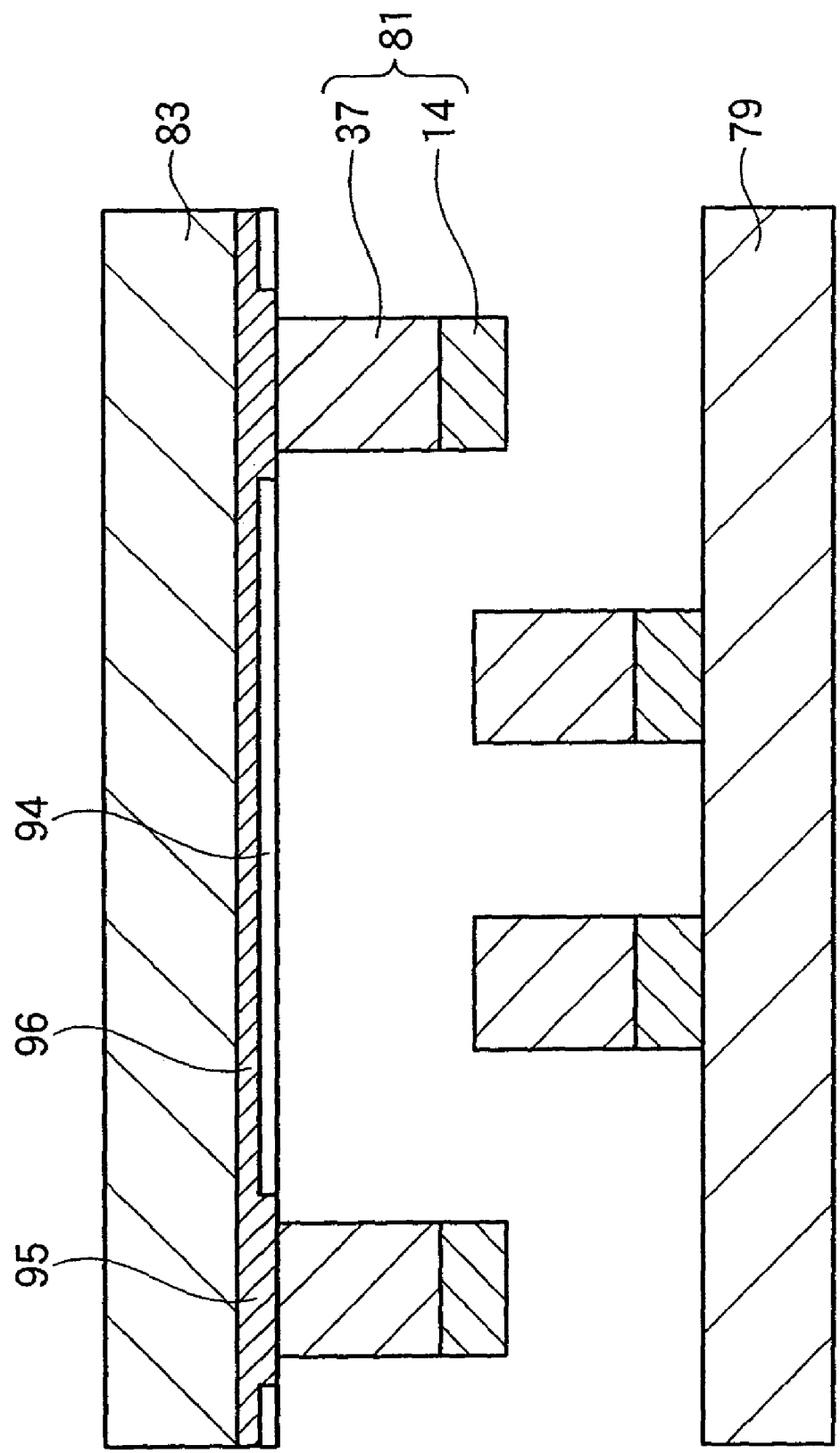
FIG. 38 is a sectional view showing a state in which some of the individual supports with semiconductor thin film pieces are lifted by the pick-up head.

When the pick-up head 83 is lifted as shown in FIG. 38, the selected transport pieces 81 are removed from the temporary installation substrate 79.

In Embodiment 4, the semiconductor thin film pieces 14 installed on the temporary installation substrate 79 at the same pitch as on the growth substrate 35, can be selectively removed, and picked up by the pick-up head 83. Those of the semiconductor thin film pieces 14 on the temporary installation substrate 79 which are at positions corresponding to the regions where the tacky-adhesive layer 96 is formed, exposed, or provided on projections, and hence corresponding to the bonding layers 19 of the IC substrate 13 are selected. In this way, the plurality of semiconductor thin film pieces 14 which have been selectively removed can be bonded all at once to the bonding layers 19 of the IC substrate 13. The semiconductor thin film pieces remaining on the temporary installation substrate 79 can be successively picked up by the pick-up head 83 in the same manner, and the semiconductor thin film pieces 14 that have been picked up can be bonded all at once to different parts of the same IC substrate or on a different IC substrate.

In this way, according to Embodiment 4, the semiconductor thin film pieces 14 which have been separated from the growth substrate 35 are temporarily installed on the temporary installation substrate 79, and are selectively removed from the temporary installation substrate 79, so when the semiconductor thin film pieces 14 are bonded to the IC substrate 13, only the semiconductor thin film pieces 14 which are intended to be bonded are brought adjacent to and bonded with the IC substrate 13, hence positioning and bonding can be easily performed.

In the above-described embodiment, the temporary installation substrate 79 is in the form of a vacuum chuck. Alternatively, it may have a tacky-adhesive layer having its tacky-adhesive force changed due to heat or light, or an attachment surface having its attachment state changed by electrical or magnetic attraction, or a force due to a pressure difference.

In the aforesaid embodiments, description is made of a semiconductor device which is used for writing data on a photosensitive drum of an image-forming apparatus, or for reading data, and which has light-emitting elements arranged in a row. The invention however is not limited to such cases. For example, the invention is also applicable where there is only one light-emitting element or there are not as many light-emitting elements as are in an LED unit, such as in an optical communication devices, and transmission and reception of multi-bit optical signals are performed using optical fibers coupled with the ends of the lenses.

When an LED head or an image-forming apparatus is manufactured using the semiconductor device of any of the above embodiments, selected semiconductor thin film pieces can be transferred all at once, so the semiconductor device of this invention can be manufactured at a low cost, and the LED head or image-forming apparatus can also be made more compact and more economical.

Figure 42:
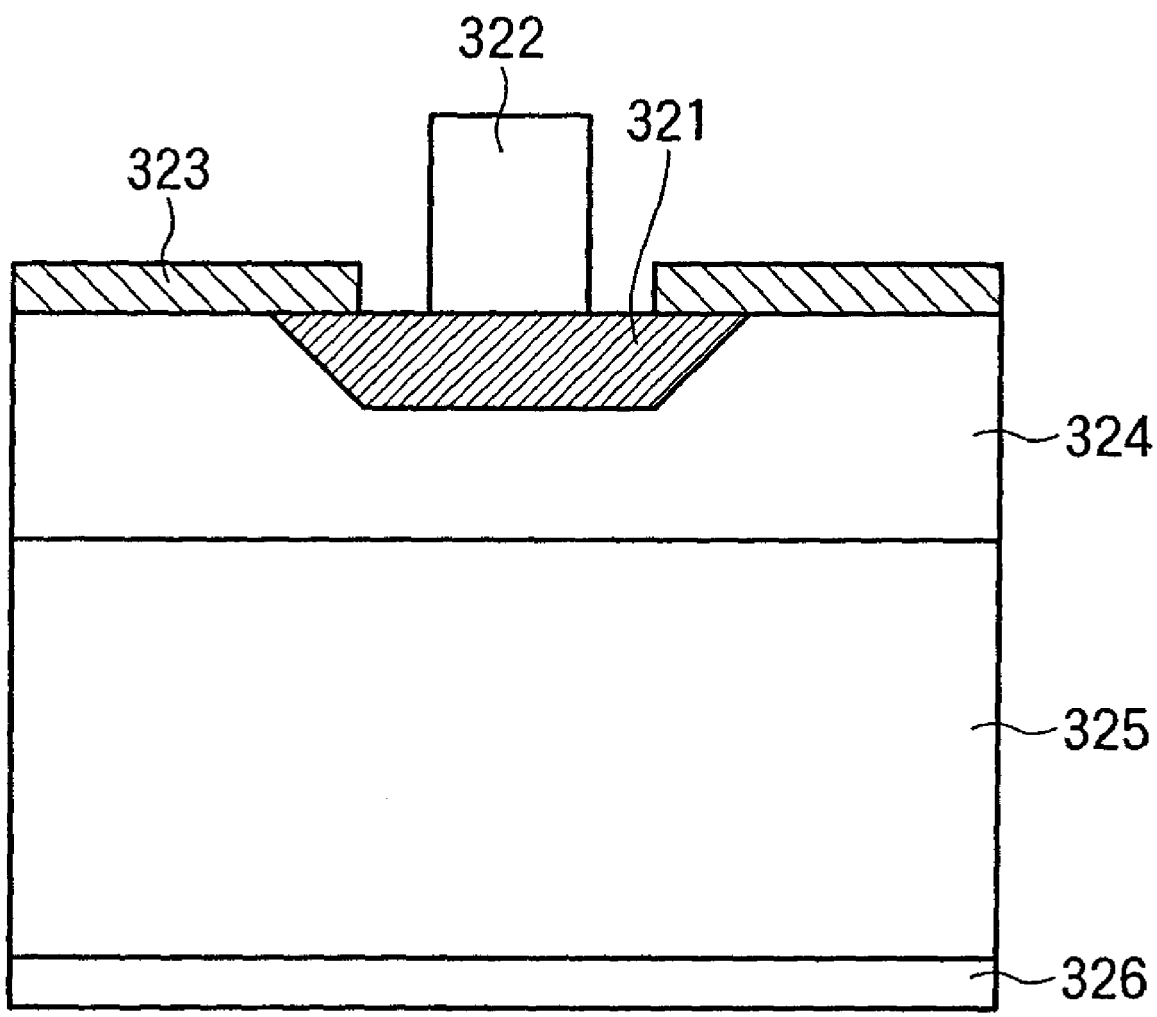
FIG. 42 is a sectional view showing the structure of a light-emitting element, including a diffusion region in an epitaxial layer.

With regard to the light-emitting elements in the aforesaid embodiments, description is made of a case where the structures of the semiconductor epitaxial layers having a pn junction is formed by element isolation etching, and each light-emitting element comprises one light-emitting part. However, a structure similar to that shown in FIG. 42 may be formed by selectively diffusing impurities in the epitaxial layer. In this case, one light-emitting element has a structure comprising a plurality of light-emitting parts. In this case, the drive elements are also made to individually correspond with the light-emitting parts.

Further, the number of rows of the light-emitting elements or light-emitting parts is not limited to one, and may be more than one. If for example the light emitting parts are arranged in two rows, light-emitting parts in one of the row may be disposed at positions intervening the positions of the light-emitting parts in the other row. In this case also, the drive elements can be made to individually correspond with the light-emitting parts.

A feature common to Embodiment 2 described with reference to FIGS. 7A to 26, and Embodiment 4 described with reference to FIGS. 28 to 39 is that a set of semiconductor thin film pieces 14 which are formed on the growth substrate 35 and which correspond to the bonding areas 18 on an IC substrate 13 are selectively bonded to the bonding layers 19 of the IC substrate 13. Before the bonding, the semiconductor thin film pieces 14 may be first separated from the growth substrate 35 and held by a support member comprising a connection support 39, as was described in Embodiment 2. The semiconductor thin film pieces 14 may be temporarily installed on a temporary installation substrate 79, and selectively picked up by a pick-up head 83, before being transferred to the IC substrate 13, as was described in Embodiment 4.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method of manufacturing a semiconductor device comprising the step of bonding semiconductor thin film pieces which have been separated from a first substrate to a plurality of bonding areas arranged at an equal pitch P2 on a surface of a second substrate, the bonding areas being higher than other areas on the second substrate, each bonding area being flat and having a width wider than or equal to a width of each semiconductor thin film piece, comprising the steps of:

separating a plurality of semiconductor thin film pieces which have been epitaxially grown on the first substrate from the first substrate so that the semiconductor thin film pieces have individual supports, and bonding the individual supports to a third substrate at a predetermined pitch P1, the pitch P2 satisfying a relationship P2=A×P1, where A is an integer greater than or equal to 1;

facing a surface of the third substrate with a surface of the second substrate while aligning the semiconductor thin film pieces bonded to the third substrate with the bonding areas on the surface of the second substrate corresponding to the predetermined semiconductor thin film pieces, and bonding the semiconductor thin film pieces at every said integer simultaneously to the second substrate, the second substrate having integrated circuits; and simultaneously separating selected plural semiconductor thin film pieces, which are bonded to the second substrate, from the third substrate.

2. A method of manufacturing a semiconductor device comprising the step of bonding semiconductor thin film pieces which have been separated from a first substrate to a plurality of bonding areas arranged at an equal pitch P2 on a surface of the second substrate, the bonding areas on the second substrate being higher than other areas on the second substrate, each bonding area being flat and having a width wider than or equal to a width of each semiconductor thin film piece, comprising the steps of:

separating a plurality of semiconductor thin film pieces formed on the first substrate from the first substrate so that the semiconductor thin film pieces have individual supports, and bonding the individual supports to a third substrate at a predetermined pitch P1, the pitch P2 satisfying a relationship P2=A×P1, where A is an integer greater than or equal to 1;

transferring the semiconductor thin film pieces which have been separated from the first substrate to a temporary installation substrate for temporary positioning;

selectively picking up the individual supports of the semiconductor thin film pieces simultaneously from the temporary installation substrate using a pick-up head;

aligning the semiconductor thin film pieces held by the pick-up head with bonding areas on the second substrate corresponding to the predetermined semiconductor thin film pieces, and bonding the predetermined semiconductor thin film pieces simultaneously to the second substrate, the second substrate having integrated circuits; and separating the semiconductor thin film pieces held by the pick-up head from the pick-up head.

3. The method according to claim 2, wherein said temporary installation substrate has a tacky-adhesive layer having its tacky-adhesive force changed due to heat or light, or an attachment surface having its attachment state changed by electrical or magnetic attraction, or a force due to a pressure difference.

4. The method according to claim 2, wherein said step of selectively picking up said semiconductor thin film pieces from said temporary installation substrate uses a pick-up head provided with areas where the tacky-adhesive layer is exposed, at positions conforming to the arrangement pitch of the semiconductor thin film pieces which are picked up simultaneously.

5. The method according to claim 2, wherein said step of selectively picking up said semiconductor thin film pieces from said temporary installation substrate uses a pick-up head having a tacky-adhesive layer having its with a tackiness that changed due to heat or light, or an attachment surface having its attachment state changed by electrical or magnetic attraction, or a force due to a pressure difference.

6. The method according to claim 2, wherein said step of selectively picking up said semiconductor thin film pieces from said temporary installation substrate uses a pick-up head projecting structures at positions conforming to the arrangement pitch of the semiconductor thin film pieces which are to be picked up simultaneously.

7. The method according to claim 6, wherein said projecting structures comprise a tacky-adhesive layer.

8. A method of manufacturing a semiconductor device comprising the step of bonding semiconductor thin film pieces which have been separated from a first substrate to bonding areas on a surface of a second substrate, the bonding areas being higher than other areas on the second substrate, each bonding area being flat and having a width wider than or equal to a width of each semiconductor thin film piece, comprising the steps of:

separating a plurality of semiconductor thin film pieces which have been epitaxially grown on the first substrate from the first substrate so that the semiconductor thin film pieces have individual supports, and bonding the individual supports to a third substrate at a predetermined pitch, wherein the third substrate has a tacky-adhesive layer for holding the semiconductor thin film pieces, the tacky-adhesive layer having its tacky-adhesive force changed due to heat or light, or an attachment surface having its attachment state changed by electrical or magnetic attraction, or a force due to a pressure difference;

facing a surface of the third substrate with a surface of the second substrate while aligning the semiconductor thin film pieces bonded to the third substrate with bonding areas on the surface of the second substrate corresponding to the predetermined semiconductor thin film pieces, and bonding the predetermined semiconductor thin film pieces simultaneously to the second substrate, the second substrate having integrated circuits; and simultaneously separating selected plural semiconductor thin film pieces, which are bonded to the second substrate, from the third substrate.

* * * * *